ized Search Report dated Nov. 8, 2005, citing Patent Abstracts of Japan

(12) United States Patent
Ohmi et al.

(10) Patent No.: US 7,670,454 B2
(45) Date of Patent: Mar. 2, 2010

(54) PLASMA PROCESSING APPARATUS

(75) Inventors: Tadahiro Ohmi, Sendai (JP); Masaki Hirayama, Sendai (JP); Shigetoshi Sugawa, Sendai (JP); Tetsuya Goto, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 13 days.

(21) Appl. No.: 11/337,026

(22) Filed: Jan. 23, 2006

(65) Prior Publication Data
US 2006/0118241 A1    Jun. 8, 2006

Related U.S. Application Data

(62) Division of application No. 10/276,721, filed as application No. PCT/JP02/03109 on Mar. 28, 2002, now abandoned.

(30) Foreign Application Priority Data

Mar. 28, 2001    (JP)    ............... 2001-094271

(51) Int. Cl.
*H01L 21/306*    (2006.01)
*C23C 16/00*    (2006.01)
(52) U.S. Cl. ............... 156/345.41; 118/723 MW
(58) Field of Classification Search ......... 118/723 MW, 118/723 ME, 723 MA, 723 AN; 156/345.33, 156/345.41, 345.42
See application file for complete search history.

(56)    References Cited

U.S. PATENT DOCUMENTS 5,024,716 A    6/1991    Sato
5,266,364 A *  11/1993   Tamura et al. ............... 427/571
5,698,036 A    12/1997   Ishii et al.
6,311,638 B1   11/2001   Ishii et al.
6,322,662 B1   11/2001   Ishii et al.
6,358,324 B1    3/2002   Hongoh et al.
6,830,652 B1   12/2004   Ohmi et al.

FOREIGN PATENT DOCUMENTS

| EP | 0 311 696 A | 4/1989 |
| JP | 03-191072 A | 8/1991 |
| JP | 09063793 | 3/1997 |
| JP | 2000-223298 A | 8/2000 |
| JP | 2000-299198 A | 10/2000 |
| WO | WO 00/74127 | 12/2000 |

OTHER PUBLICATIONS

European Search Report dated Nov. 8, 2005, citing *Patent Abstracts of Japan*, vol. 2000, No. 11, Jan. 3, 2001—see JP 2000 223298A listed above.

* cited by examiner

*Primary Examiner*—Luz L. Alejandro
(74) *Attorney, Agent, or Firm*—Finnegan, Henderson, Farabow, Garrett & Dunner, LLP

(57)    ABSTRACT

In a microwave plasma processing apparatus, the reflection of microwave by the joint unit between the microwave supplying waveguide and the microwave antenna is reduced by providing a taper surface or a member having a medium permittivity between the microwave supplying waveguide and the microwave antenna so as to moderate an impedance change. Accordingly, the efficiency of power supplying is improved, and reduced discharge ensures stable formation of plasma.

2 Claims, 18 Drawing Sheets

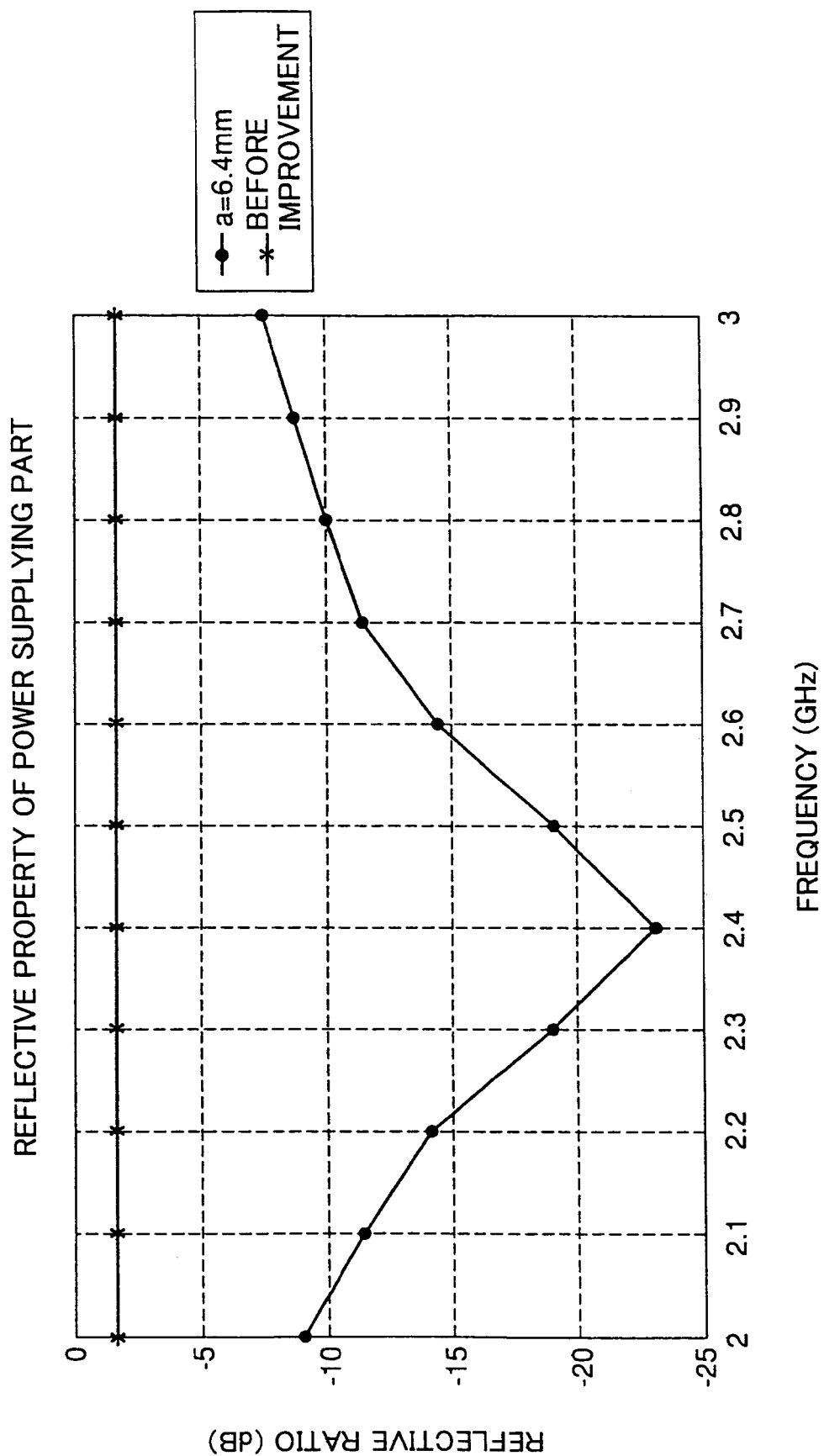

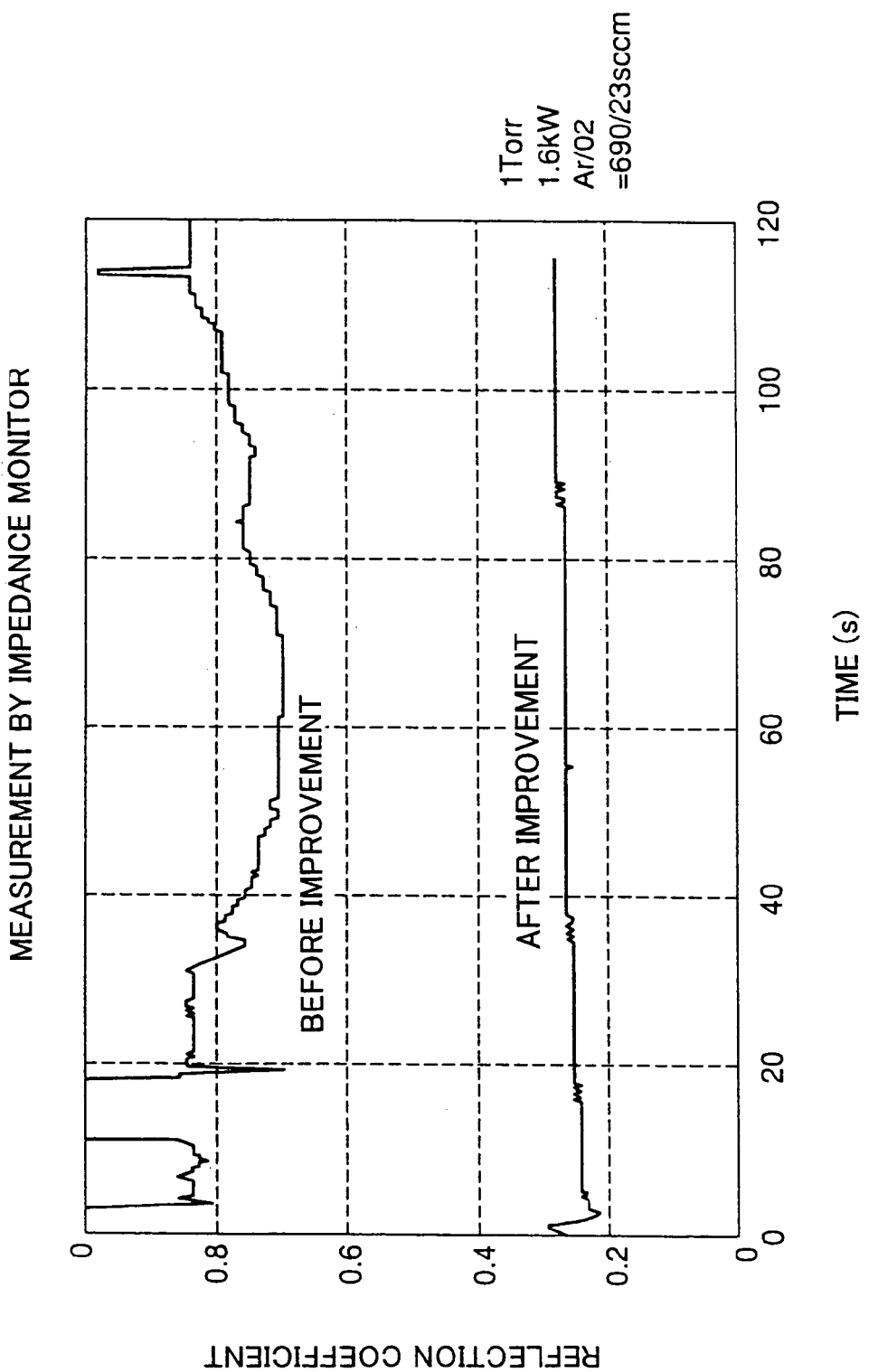

PLASMA PROCESSING APPARATUS

This is a division of application Ser. No. 10/276,721, filed Nov. 18, 2002, now abandoned currently pending, which was derived from WO 02/080250 (PCT/JP02/03109, filed Mar. 28, 2002) and Japanese Application 2001-094271, filed Mar. 28, 2001, all of which are incorporated herein by reference.

TECHNICAL FIELD

The present invention is generally related to a plasma processing apparatus, and more particularly, to a microwave plasma processing apparatus.

Plasma processing and plasma processing apparatuses are an indispensable technology for fabricating ultrafine semiconductor devices these days called deep submicron devices or deep subquarter micron devices characterized by a gate length of near 0.1 μm or less, and for fabricating ultra high-resolution flat-panel display devices including liquid crystal display devices.

Conventionally, various plasma excitation methods have been used in plasma processing apparatuses used for fabrication of semiconductor devices and liquid crystal display devices. Particularly, a parallel-plate type high-frequency excitation plasma processing apparatus or an induction-coupled plasma processing apparatus are commonly used. However, such conventional plasma processing apparatuses have a drawback of non-uniform plasma formation in that the region of high electron density is limited, and it has been difficult to conduct a uniform process over the entire substrate surface with a high processing rate, and hence with high throughput. This problem becomes particularly acute when processing a large diameter substrate. Further, such a conventional plasma processing device has several inherent problems associated with its high electron temperature, in that the semiconductor devices formed on the substrate sustain damage and that significant metal contamination is caused as a result of sputtering of a chamber wall. Thus, there are increasing difficulties for such conventional plasma processing apparatuses to meet the stringent demand of further device miniaturization and further improvement of productivity in manufacturing semiconductor devices and liquid crystal display devices.

Meanwhile, there are proposals of a microwave plasma processing apparatus that uses high-density plasma excited by a microwave electric field, in place of a direct-current magnetic field. For example, there is a proposal of a plasma processing apparatus that causes excitation of plasma by radiating a microwave into a processing vessel from a planar antenna (radial line slot antenna) having a number of slots disposed so as to form a uniform microwave, such that the microwave electric field causes ionization of a gas in a vacuum vessel. (See for example Japanese Laid-Open Patent Application 9-63793). In the microwave plasma thus excited, it is possible to realize a high plasma density over a wide area right underneath the antenna, and it becomes possible to conduct uniform plasma processing in a short duration. The microwave plasma thus formed is characterized by low electron temperature, and damaging or metal contamination of the substrate is avoided. Further, it is possible to form uniform plasma over a large surface area, and it can be easily applied to the fabrication process of a semiconductor device using a large diameter semiconductor substrate and a large size liquid crystal display device.

BACKGROUND ART

FIGS. 1A and 1B show the construction of a conventional microwave plasma processing apparatus 100 having such a radial line slot antenna, wherein FIG. 1A shows the microwave plasma processing apparatus in a cross-sectional view while FIG. 1B shows the construction of the radial line slot antenna.

Referring to FIG. 1A, the microwave plasma processing apparatus 100 has a processing chamber 101 evacuated from plural evacuation ports 116, and a stage 115 is formed for holding a substrate 114 to be processed. In order to realize uniform evacuation in the processing chamber 101, a ring-shaped space 101A is formed around the stage 115, and the plural evacuation ports 116 are formed in communication with the foregoing space 101A at a uniform interval, and hence in axial symmetry with regard to the substrate. Thereby, it becomes possible to evacuate the processing chamber 101 uniformly through the space 101A and the evacuation ports 116.

On the processing chamber 101, there is formed a shower plate 103 of plate-like form at the location corresponding to the substrate 114 on the stage 115 as a part of the outer wall of the processing chamber 101, and the shower plate 103 is sealed with respect to the processing chamber 101 via a seal ring 109, wherein the shower plate 103 is formed of a dielectric material of small loss and includes a large number of apertures 107. Further, a cover plate 102 also of a dielectric material of small loss is provided on the outer side of the shower plate 103, and the cover plate 102 is sealed with respect to the shower plate 103 via another seal ring 108.

The shower plate 103 is formed with a passage 104 for a plasma gas on the top surface thereof, and each of the plural apertures 107 are formed in communication with the foregoing plasma gas passage 104. Further, there is formed a plasma gas supply passage 108 in the interior of the shower plate 103 in communication with a plasma gas supply port 105 provided on the outer wall of the processing vessel 101. Thus, the plasma gas of Ar, Kr or the like supplied to the foregoing plasma gas supply port 105 is supplied to the foregoing apertures 107 from the supply passage 108 via the passage 104 and is released into a space 101B underneath the shower plate 103 in the processing vessel 101 from the apertures 107 with substantially uniform concentration.

On the processing vessel 101, there is provided a radial line slot antenna 110 having a radiation surface shown in FIG. 1B on the outer side of the cover plate 102 with a separation of 4-5 mm from the cover plate 102. The radial line slot antenna 110 is connected to an external microwave source (not shown) via a coaxial waveguide 110A and causes excitation of the plasma gas released into the space 101B by the microwave from the microwave source. It should be noted that the gap between the cover plate 102 and the radiation surface of the radial line slot antenna 110 is filled with air.

The radial line slot antenna 110 is formed of a flat disk-like antenna body 110B connected to an outer waveguide of the coaxial waveguide 110A and a radiation plate 110C is provided on the mouth of the antenna body 110B, wherein the radiation plate 110C is formed with a number of slots 110a and slots 110b wherein slots 110b are formed in a direction crossing the slots 110a perpendicularly as represented in FIG.

1B. Further, a retardation plate 110D of a dielectric film of uniform thickness is inserted between the antenna body 110B and the radiation plate 110C.

In the radial line slot antenna 110 of such a construction, the microwave supplied from the coaxial waveguide 110 spreads between the disk-like antenna body 110B and the radiation plate 110C as it is propagated in the outward radial directions, wherein there occurs a compression of wavelength as a result of the action of the retardation plate 110D. Thus, by forming the slots 110a and 110b in concentric relationship in correspondence to the wavelength of the radially propagating microwave so as to cross perpendicularly with each other, it becomes possible to emit a plane wave having a circular polarization state in a direction substantially perpendicular to the radiation plate 110C.

By using such a radial line slot antenna 110, uniform plasma is formed in the space 101B underneath the shower plate 103. The high-density plasma thus formed is characterized by a low electron temperature and thus no damage is caused to the substrate 114 and no metal contamination occurs due to sputtering of the vessel wall of the processing vessel 101.

In the plasma processing apparatus of FIG. 1, it should further be noted that there is provided a conductor structure 111 in the processing vessel 101 between the shower plate 103 and the substrate 114, wherein the conductor structure 111 is formed with a number of nozzles 113 supplied with a processing gas from an external processing gas source (not shown) via a processing gas passage 112 formed in the processing vessel 101, and each of the nozzles 113 releases the processing gas supplied thereto into a space 101C between the conductive structure 111 and the substrate 114. It should be noted that the conductive structure 111 is formed with openings between adjacent nozzles 113 with a size such that the plasma formed in the space 101B passes efficiently from the space 101B to the space 101C by way of diffusion.

Thus, in the case wherein a processing gas is released into the space 101C from the conductive structure 111 via the nozzles 113, the processing gas is excited by the high-density plasma formed in the space 101B and uniform plasma processing is conducted on the substrate 114 efficiently and at a high rate, without damaging the substrate or the devices on the substrate, and without contaminating the substrate. Further, it should be noted that the microwaves emitted from the radial line slot antenna 110 are blocked by the conductive structure 111 and there is no possibility of such microwaves causing damage to the substrate 114.

By the way, it is necessary in the case of the plasma processing apparatus 100 to efficiently supply high-power microwaves formed by a microwave source (not shown) to the radial line slot antenna 110.

An impedance matching structure is generally provided between a microwave antenna and a waveguide connected to the microwave antenna to inject a weak microwave signal received by the microwave antenna into the waveguide without loss. Meanwhile, in the case of the plasma processing apparatus 100 of FIG. 1, high-power microwaves are provided to the radial line slot antenna 110 through the waveguide, and additionally, reflective microwaves reflected by the plasma formed in the processing vessel 101 are also superimposed on the high-power microwaves in the antenna 110 and the waveguide. There is a possibility of abnormal discharge being caused in the radial line slot antenna 110 and the coaxial waveguide due to inappropriate impedance matching between the antenna body 110 and the waveguide. Accordingly, the impedance matching of the power supply unit connecting the waveguide and the antenna body 110 is much more important than usual.

DISCLOSURE OF THE INVENTION

Accordingly, it is an object of the present invention to provide a novel and useful plasma processing apparatus wherein the foregoing problems are eliminated.

Another and more specific object of the present invention is to provide a plasma processing apparatus having a microwave antenna, forming plasma in the processing vessel by providing microwaves from the microwave antenna to the processing vessel through the microwave transparent window, and processing the substrate in the plasma, in which the efficiency of supplying microwaves from the microwave waveguide to the microwave antenna is increased, and the abnormal discharge problem due to the mismatching of impedance at the joint unit between the microwave waveguide and the microwave antenna is eliminated.

Yet another object of the present invention is to provide a plasma processing apparatus, comprising, a processing vessel defined by an outer wall and having a stage for holding a substrate to be processed, an evacuation system coupled to said processing vessel, a microwave transparent window provided on said processing vessel as a part of said outer wall, and opposite said substrate held on said stage, a plasma gas supplying part for supplying plasma gas to said processing vessel, a microwave antenna provided on said processing vessel in correspondence to said microwave, and a microwave power source electrically coupled to said microwave antenna, wherein said microwave antenna comprising a coaxial waveguide connected to said microwave power source, said coaxial waveguide having an inner conductor core and an outer conductor tube surrounding said inner conductor core, and an antenna body provided to a point of said coaxial waveguide, said antenna body further comprising a first conductor surface forming a microwave radiation surface coupled with said microwave transparent window, and a second conductor surface opposite said first conductor surface via a dielectric plate, said second conductor surface being connected to said first conductor surface at a peripheral part of said dielectric plate, said inner conductor core is connected to said first conductor surface by a first joint unit, said outer conductor tube is connected to said second conductor surface by a second joint unit, said first joint unit forms a first taper unit in which an outer diameter of said inner conductor core increases toward said first conductor surface, and said second joint unit forms a second taper unit in which an inner diameter of said outer conductor tube increases toward said first conductor surface.

Another object of the present invention is to provide a plasma processing apparatus, comprising, a processing vessel defined by an outer wall and having a stage for holding a substrate to be processed, an evacuation system coupled to said processing vessel, a microwave transparent window provided on said processing vessel as a part of said outer wall, opposite said substrate held on said stage, a plasma gas supplying part for supplying plasma gas to said processing vessel, a microwave antenna provided on said processing vessel in correspondence to said microwave, and a microwave power source electrically coupled to said microwave antenna, wherein said microwave antenna comprising a coaxial waveguide connected to said microwave power source, said coaxial waveguide having an inner conductor core and an outer conductor tube surrounding said inner conductor core, and an antenna body provided to a point of said coaxial waveguide, said antenna body further comprising a first conductor surface forming microwave a radiation surface coupled with said microwave transparent window, and a second conductor surface opposite said first conductor surface via a dielectric plate, said second conductor surface being connected to said first conductor surface at a peripheral part of said dielectric plate, said inner conductor core is connected to said first conductor surface by a first joint unit, said outer conductor tube is connected to said second conductor surface by a second joint unit, a dielectric member is provided in a space between said inner conductor core and said outer conductor tube, defined by a first edge face and a second edge face opposing said first edge face, said first edge face being adjacent to said dielectric plate, a permittivity of said dielectric member being lower than a permittivity of said dielectric plate and higher than a permittivity of air.

According to the present invention, the rapid change in impedance by the joint unit between the microwave waveguide and the microwave antenna is avoided. As a result, microwaves reflected by the joint unit are efficiently reduced. As the reflective waves are reduced, abnormal discharge at the joint unit and consequent damage on the antenna caused by the abnormal discharge is avoided. Additionally, the reduction in the reflective waves stabilizes the supply of microwaves to the processing vessel through the microwave transparent window, and makes it possible to form stable plasma in the processing vessel as desired.

Other features and advantages of the present invention will become more apparent from the following best mode for implementing the invention when read in conjunction with the accompanying drawings.

BRIEF DESCRIPTION OF THE DRAWINGS

FIG. 4 is a graph showing the effect of eliminating reflection by the construction of FIG. 3;

FIG. 5 is a graph showing the reflection coefficient measured for the microwave plasma formed in the plasma processing apparatus of FIGS. 2A and 2B using the power supplying structure of FIG. 3;

BEST MODE FOR IMPLEMENTING THE INVENTION

Preferred embodiments of the present invention will be described below.

FIRST EMBODIMENT

Figure 2A:
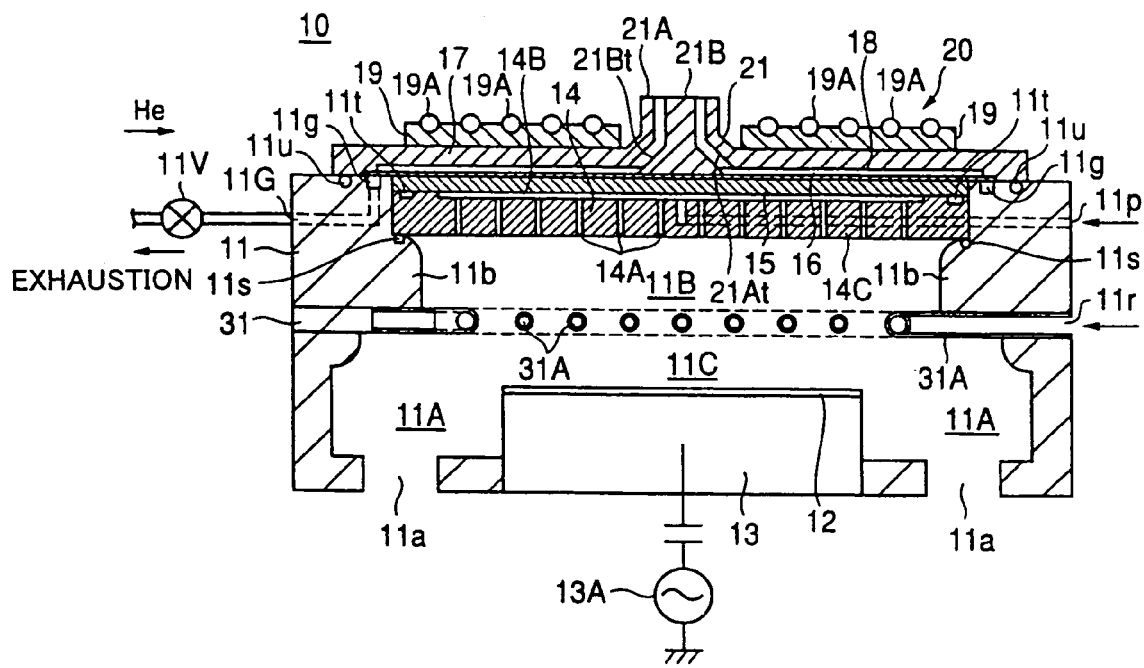
FIGS. 2A and 2B are diagrams showing the construction of a microwave plasma processing apparatus according to a first embodiment of the present invention.
Figure 2B:
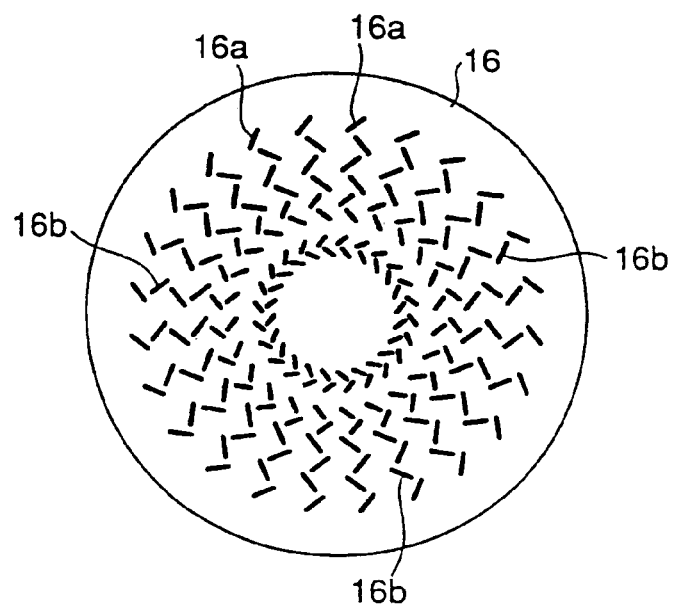

FIGS. 2A and 2B are diagrams showing the construction of a microwave plasma processing apparatus 10 according to a first embodiment of the present invention.

Referring to FIG. 2A, the microwave plasma processing apparatus 10 includes a processing vessel 11 and a stage 13 provided in the processing vessel 11 for holding a substrate 12 to be processed by an electrostatic chuck, wherein the stage 13 is preferably formed of AlN or $Al_2O_3$ by a hot isostatic pressing (HIP) process. In the processing vessel 11, there are formed two or three evacuation ports 11a in a space 11A surrounding the stage 13 with an equal distance, and hence with an axial symmetry with respect to the substrate 12 on the stage 13. The processing vessel 11 is evacuated to a low pressure via the evacuation ports 11a by a gradational lead screw pump.

The processing vessel 11 is preferably formed of an austenite stainless steel containing Al, and there is formed a protective film of aluminum oxide on the inner wall surface by an oxidizing process. Further, there is formed a disk-shaped shower plate 14 of dense $Al_2O_3$, formed by a HIP process, in the part of the outer wall of the processing vessel 11 corresponding to the substrate 12 as a part of the outer wall, wherein the shower plate 14 includes a large number of nozzle apertures 14A. The $Al_2O_3$ shower plate 14 thus formed by the HIP process is formed by using an $Y_2O_3$ additive and has porosity of 0.03% or less. This means that the $Al_2O_3$ shower plate is substantially free from pores or pinholes and has a very large, while not so large as that of AlN, thermal conductivity for a ceramic of 30 W/m·K.

The shower plate 14 is mounted on the processing vessel 11 and sealed thereto via a seal ring 11s, and a cover plate 15 of dense $Al_2O_3$ formed also by an HIP process is provided on the shower plate 14 and sealed thereto via a seal ring 1it. The shower plate 14 is formed with a depression 14B communicating with each of the nozzle apertures 14A and serving as a plasma gas passage, a side thereof formed by the cover plate 15. The depression 14B also communicates with another plasma gas passage 14C formed in the interior of the shower plate 14 in communication with a plasma gas inlet 11p formed on the outer wall of the processing vessel 11.

The shower plate 14 is held by an extending part 11b formed on the inner wall of the processing vessel 11, wherein the extending part 11b is formed with a round surface at the part holding the shower plate 14 so as to suppress electric discharge.

Thus, plasma gas such as Ar or Kr supplied to the plasma gas inlet 11p is supplied to a space 11B underneath the shower plate 14 uniformly via the apertures 14A after being passed through the passage 14C and the depression 14B in the shower plate 14.

Figure 3A:
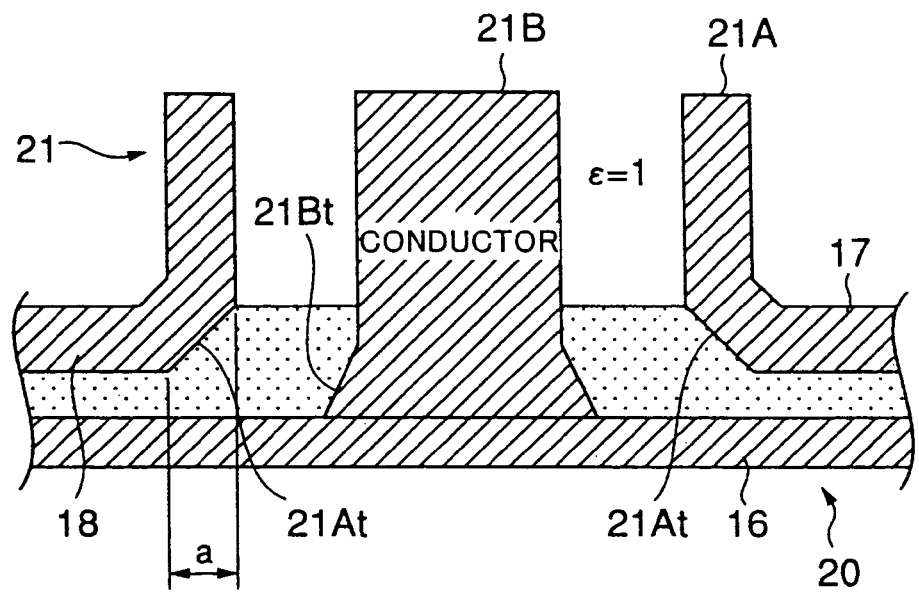
FIGS. 3A and 3B are diagrams showing the construction of the joint between a coaxial waveguide and a radial line slot antenna of the apparatus of FIG. 2.
Figure 3B:
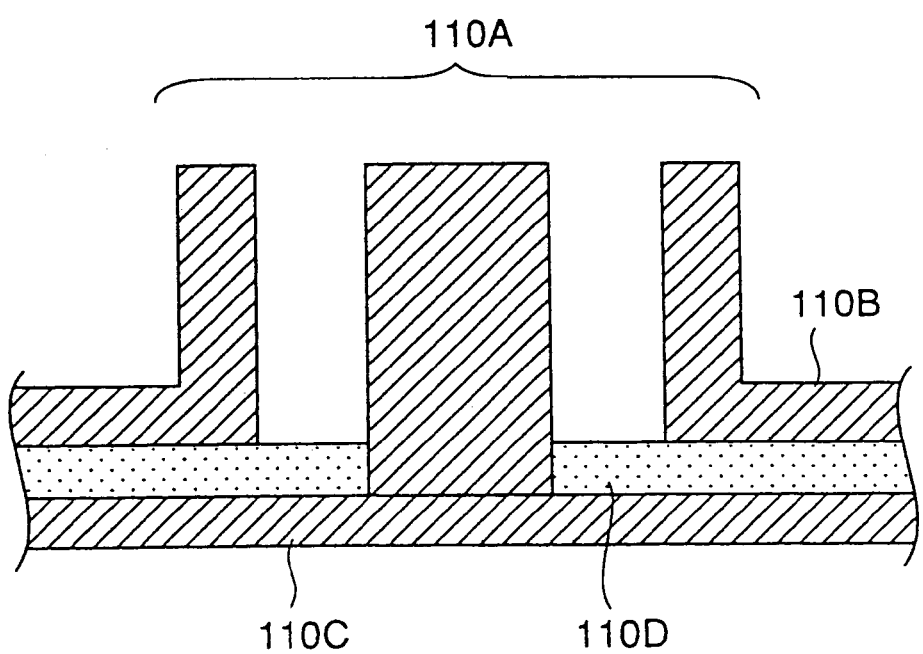

On the cover plate 15, there is provided a radial line slot antenna 20 formed of a disk-shaped slot plate 16 formed with a number of slots 16a and 16b shown in FIG. 3B in intimate contact with the cover plate 15, a disk-shaped antenna body 17 holding the slot plate 16, and a retardation plate 18 of a dielectric material of low loss such as $Al_2O_3$, $SiO_2$ or $Si_3N_4$ sandwiched between the slot plate 16 and the antenna body 17. The radial line slot antenna 20 is mounted on the processing vessel 11 and sealed thereto by way of a seal ring 11u, and a microwave of 2.45 GHz or 8.3 GHz frequency is fed to the radial line slot antenna 20 from an external microwave source (not shown) via a coaxial waveguide 21. The microwave thus supplied is radiated into the interior of the processing vessel from the slots 16a and 16b in the slot plate 16 via the cover plate 15 and the shower plate 14. Thereby, the microwaves cause excitation of plasma in the plasma gas supplied from the apertures 14A in the space 11B underneath the shower plate 14. It should be noted that the cover plate 15 and the shower plate 14 are formed of $Al_2O_3$ and function as an efficient microwave-transmitting window. In order to avoid plasma excitation in the plasma gas passages 14A-14C, the plasma gas is held at a pressure of about 6666 Pa-13332 Pa (about 50-100 Torr) in the foregoing passages 14A-14C.

In order to improve intimate contact between the radial line slot antenna 20 and the cover plate 15, the microwave plasma processing apparatus 10 of the present embodiment has a ring-shaped groove 11g in a part of the processing vessel 11 so as to be adjacent to the slot plate 16. By evacuating the groove 11g via an evacuation port 11G communicating therewith, the pressure in the gap formed between the slot plate 16 and the cover plate 15 is reduced and the radial line slot antenna 20 is urged firmly upon the cover plate 15 by the atmospheric pressure. It is noted that such a gap includes not only the slots 16a and 16b formed in the slot plate 16 but also a gap formed for various other reasons. It should be noted further that such a gap is sealed by the seal ring 11u provided between the radial line slot antenna 20 and the processing vessel 11.

By filling the gap between the slot plate 16 and the cover plate 15 with an inert gas of small molecular weight via the evacuation port 11G and the groove 11g, heat transfer from the cover plate 15 to the slot plate 16 is facilitated. It is preferable to use He for such an inert gas in view of large thermal conductivity and large ionization energy. In the case wherein the gap is filled with He, it is preferable to set the pressure to about 0.8 atm. In the construction of FIG. 3, there is provided a valve 11V on the evacuation port 11G for the evacuation of the groove 15g and filling of the inert gas into the groove 15g.

It is noted that an outer waveguide 21A of the coaxial waveguide 21A is connected to the disk-shaped antenna body 17 while a center conductor 21B is connected to the slot plate 16 via an opening formed in the retardation plate 18. Thus, the microwave fed to the coaxial waveguide 21A is propagated in the outer radial directions between the antenna body 17 and the slot plate 16 and is emitted from the slots 16a and 16b.

FIG. 2B shows the slots 16a and 16b formed in the slot plate 16.

Referring to FIG. 2B, the slots 16a are arranged concentrically, and the slots 16b, each corresponding to a slot 16a and being perpendicular to the corresponding slot 16a, are also arranged concentrically. The slots 16a and 16b are formed with an interval corresponding to the wavelength of the microwave compressed by the retardation plate 18 in the radial direction of the slot plate 16, and as a result, the microwave is radiated from the slot plate 16 in the form of a near plane wave. Because the slots 16a and the slots 16b are formed in a mutually perpendicular relationship, the microwave thus radiated forms a circularly polarized wave including two perpendicular polarization components.

In the plasma processing apparatus 10 of FIG. 2A, there is provided a cooling block 19 formed with a cooling water passage 19A on the antenna body 17, and the heat accumulated in the shower plate 14 is absorbed via the radial line slot antenna 20 by cooling the cooling block 19 with cooling water in the cooling water passage 19A. The cooling water passage 19A is formed on the cooling block 19 in a spiral form, and cooling water having a controlled oxidation-reduction potential is supplied thereto, wherein the control of the oxidation reduction potential is achieved by eliminating oxygen dissolved in the cooling water by way of bubbling of an $H_2$ gas.

In the microwave plasma processing apparatus 10 of FIG. 2A, there is further provided a process gas supply structure 31 in the processing vessel 11 between the shower plate 14 and the substrate 12 on the stage 13, wherein the process gas supply structure 31 has gas passages 31A arranged in a lattice shape and releases a process gas supplied from a process gas inlet port 11r provided in the outer wall of the processing vessel 11 through a large number of process gas nozzle apertures 31B (see FIG. 4). Thereby, desired uniform substrate processing is achieved in a space 11C between the process gas supply structure 31 and the substrate 12. Such substrate processing includes plasma oxidation processing, plasma nitridation processing, plasma oxynitridation processing, and plasma CVD processing. Further, it is possible to conduct a reactive ion etching of the substrate 12 by supplying a readily decomposing fluorocarbon gas such as $C_4F_8$, $C_5F_8$ or $C_4F_6$ or an etching gas containing F or Cl from the process gas supply structure 31 to the space 11C and further by applying a high-frequency voltage to the stage 13 from a high-frequency power source 13A.

In the microwave plasma processing apparatus 10 of the present embodiment, it is possible to avoid deposition of reaction byproducts on the inner wall of the processing vessel by heating the outer wall of the processing vessel 11 to a, temperature of about 150° C. Thereby, the microwave plasma processing apparatus 10 can be operated constantly and with reliability, by merely conducting a dry cleaning process once a day or so.

In the case of the plasma processing apparatus 10 of FIG. 2A, a taper unit 21Bt of the center conductor 21B is formed at the joint/power supplying unit that connects the coaxial waveguide 21 to the radial line slot antenna 20, so that the radius or the cross sectional area of the center conductor 21B gradually increases towards the slot plate 16. Thus, the rapid change in impedance caused by the joint/power supply unit is smoothed by forming such a taper structure, which results in a great reduction of reflective waves caused by the rapid change in impedance.

FIG. 3A is an expanded diagram showing in detail the construction of the joint/microwave supplying unit between the coaxial waveguide 21 and the radial line slot antenna 20 of the plasma processing apparatus 10 of FIG. 2A. The slots 16a and 16b formed on the slot plate 16 are not shown to simplify the drawing.

Referring to FIG. 3A, the inner conductor 21B has a circular cross section having a diameter of 16.9 mm. A 4 mm-thick alumina plate having a relative permittivity of 10.1 is formed between the slot plate 16 and the antenna body 17 as the retardation plate 18. The outer waveguide 21A defines a cylindrical space having a circular cross section having an inner diameter of 38.8 mm in which the inner conductor 21B is provided.

As shown in FIG. 3A, the cross sectional area of the inner conductor 21B is gradually increased from 7 mm above the joint between the inner conductor 21B and the slot plate 16 to the joint. As a result, the inner conductor 21B has a circular cross section of a diameter of 23 mm at the joint. Additionally, the antenna body 17 is provided with a taper surface 21At corresponding to the taper surface 21Bt thus formed, the taper surface 21At starting from the position 10 mm (the thickness of the retardation plate 18 4 mm+the thickness of the antenna body 17 6 mm=10 mm) above the joint of the inner conductor 21B and the slot plate 16.

FIG. 4 shows the reflective ratio of microwave provided to the antenna 20 through the waveguide 21 in the case where the radial line slot antenna 20 and the waveguide 21 are used as shown in FIG. 3A, and the parameter "a" shown in FIG. 3A is set at 6.4 mm. In FIG. 4, the reflective ratio is indicated by "•". In addition, "*" shown in FIG. 4 indicates a reflective ratio of the construction shown in FIG. 3B to which the taper units 21At and 21Bt are not provided.

Referring to FIG. 4, the reflective microwave includes not only the microwave reflected by the joint/supplying unit between the waveguide 21 the radial line antenna 20, but also the microwave reflected by the plasma. In the case of the construction of FIG. 3B, the reflective ratio is about −2 dB regardless of a frequency, which means about 80% of the microwave is reflectively returned to the waveguide 21 and the microwave source connected to the waveguide 21.

To the contrary, in the case of the construction of FIG. 3A to which the taper surfaces 21At and 21Bt are provided, the reflective ratio depends on the frequency of the microwave. The reflective ratio becomes the minimum −23 dB (about 14%) in the neighborhood of 2.4 GHz at which the plasma is excited.

FIG. 5 shows a microwave reflection factor measured by a power monitor provided between the waveguide 21 and the microwave source in the case of the antenna construction shown in FIG. 3A under the following condition: the inner pressure in the processing vessel being set at 133 Pa (about 1 Torr), Ar and $O_2$ being supplied from the shower plate 14 at a flux of 690 SCCM and 23 SCCM, respectively, and microwaves of a frequency 2.45 GHz and a power of 1.6 kW is supplied from the waveguide 21 to the radial line slot antenna 20. Accordingly, the reflective factor includes not only the reflection of microwave by the joint between the waveguide 21 and the antenna 20, but also the reflection by the plasma formed under the shower plate 14 in the processing vessel 11.

Referring to FIG. 5, it is noted that in the case of the joint construction of FIG. 3B, the reflective ratio is about 80% (the factor of reflection≈0.8), but in the case of the joint construction of FIG. 3A, the reflective ratio is reduced to about 30% (the factor of reflection≈0.3) and substantially constant. Since the reflection ratio at the joint unit between the coaxial waveguide 21 and the radial line antenna 20 is about 14% as shown in FIG. 4, the reflective ratio of about 30% as shown in FIG. 5 includes the reflection by the plasma.

Figure 6:
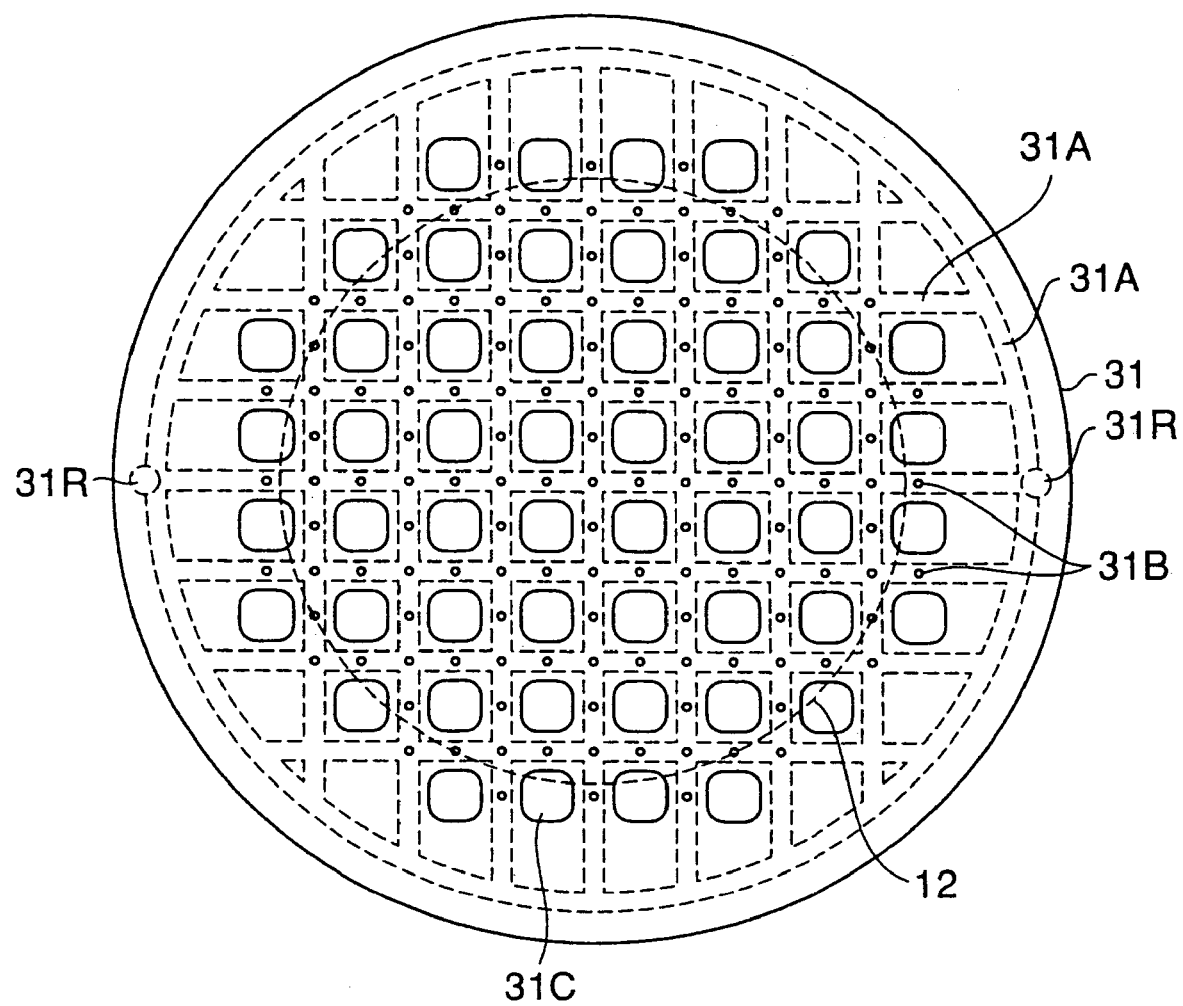
FIG. 6 is a diagram showing the construction of the process gas supplying structure of the microwave plasma processing apparatus shown in FIG. 2A.

FIG. 6 is a bottom view showing the construction of the process gas supply structure 31 of FIG. 2A.

Referring to FIG. 6, the process gas supply structure 31 is formed by a conductive body such as an Al alloy containing Mg or a stainless steel added with Al. The lattice shaped gas passage 31A is connected to the process gas inlet port 11r at a process gas supply port 31R and releases the process gas uniformly into the foregoing space 11C from the process gas nozzle apertures 31B formed at the bottom surface. Further, openings 31C are formed in the process gas supply structure 31 between the adjacent process gas passages 31A for passing the plasma or the process gas contained in the plasma therethrough. In the case wherein the process gas supply structure 31 is formed of an Al alloy containing Mg, it is preferable to form a fluoride film on the surface thereof. In the case wherein the process gas supplying structure 31 is formed of a stainless steel added with Al, it is preferable to form a passivation film of aluminum oxide on the surface thereof. In the plasma processing apparatus 10 of the present invention, the energy of incident plasma is low because of the low electron temperature of the excited plasma, and the problem of metal contamination of the substrate 12 by the sputtering of the process gas supply structure 31 is avoided. Further, it is possible to form the process gas supply structure 31 by a ceramic such as alumina.

The lattice shaped process gas passages 31A and the process gas nozzle apertures 31B are formed so as to encompass an area slightly larger than the substrate 12 represented in FIG. 4 by a broken line. By providing the process gas supply structure 31 between the shower plate 14 and the substrate 12, the process gas is excited by the plasma and uniform processing becomes possible by using such plasma excited process gas.

In the case of forming the process gas supply structure 31 by a conductor such as a metal, the process gas supply structure 31 can form a shunting plane of the microwaves by setting the interval between the lattice shaped process gas passages 31A shorter than the microwave wavelength. In such a case, the microwave excitation of plasma takes place only in the space 11B, and there occurs excitation of the process gas in the space 11C including the surface of the substrate 12 by the plasma that has caused diffusion from the excitation space 11B. Further, such a construction can prevent the substrate from being exposed directly to the microwave at the time of ignition of the plasma, and thus, damaging of the substrate by the microwave is avoided.

In the microwave plasma processing apparatus 10 of the present embodiment, the supply of the process gas is controlled uniformly by the process gas supply structure 31, and the problem of excessive dissociation of the process gas on the surface of the substrate 12 is eliminated. Thus, it becomes possible to conduct the desired substrate processing even in the case wherein there is formed a structure of large aspect ratio on the surface of the substrate 12 up to the very bottom of the high aspect ratio structure. This means that the microwave plasma processing apparatus 10 is effective for fabricating various semiconductor devices of different generations characterized by different design rules.

Figure 7:
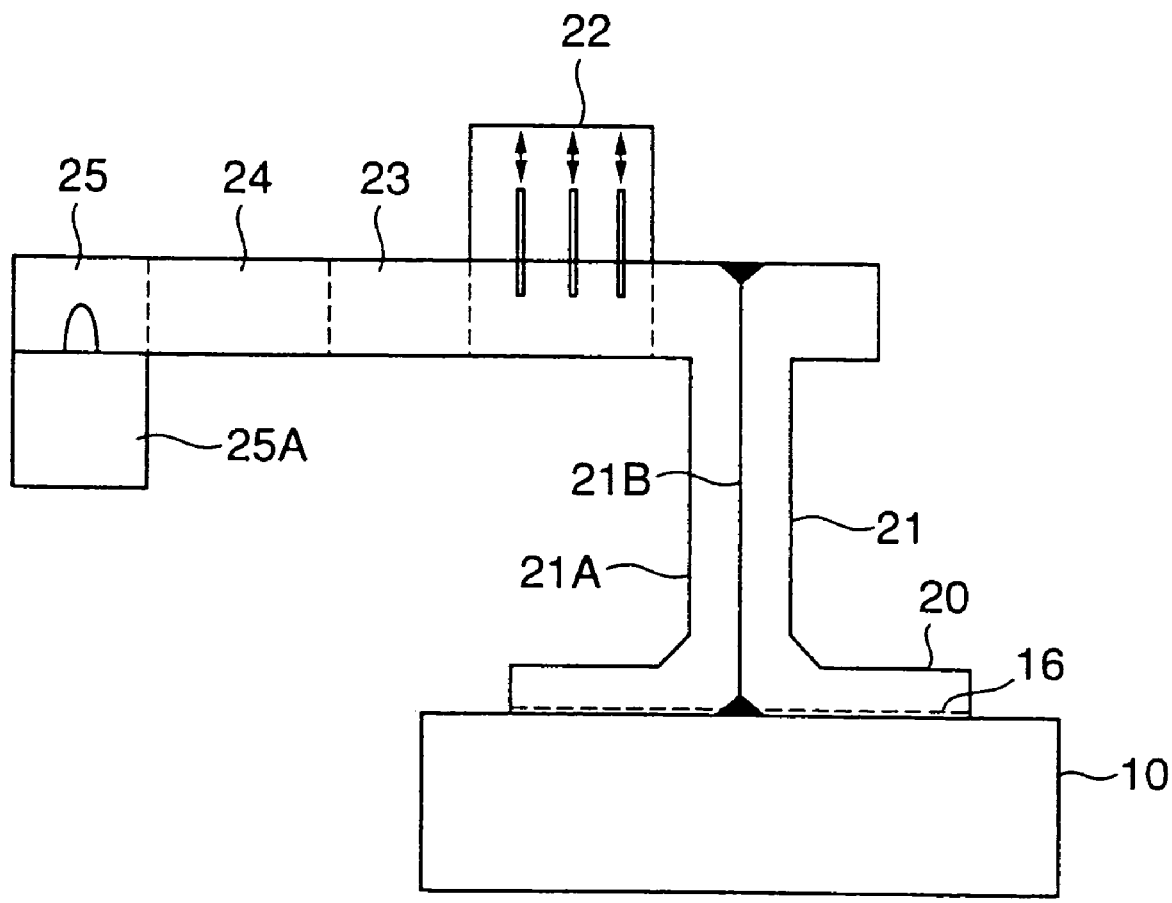
FIG. 7 is a diagram showing the construction of the microwave power source coupled to the microwave plasma processing apparatus of FIG. 2A.

FIG. 7 shows the schematic construction of the microwave source connected to the coaxial waveguide 21 of FIG. 2A.

Referring to FIG. 7, the coaxial waveguide is connected to an edge of the waveguide extending from an oscillation part 25 including therein a magnetron 25A oscillating at the frequency of 2.45 GHz or 8.3 GHz via an isolator 24, a power monitor 23 and a tuner 22 in this order. Thus, the microwave formed by the oscillator 25 is supplied to the radial line slot antenna 20, and the microwave reflected back from the high-density plasma formed in the plasma processing apparatus 10 is returned again to the radial line slot antenna 20 after conducting an impedance adjustment by the tuner 22. Further, the isolator 24 is an element having directivity and functions so as to protect the magnetron 25A in the oscillation part 25 from the reflection wave.

In the microwave plasma processing apparatus 10 of the present embodiment, the rapid change in impedance caused by the joint is reduced by forming the taper units 21At and 21Bt at the joint, or the power supplying unit, between the coaxial waveguide 21 and the radial line slot antenna 20. As a result, the reflection of microwaves caused by the rapid change in impedance is suppressed, which makes the supplying of microwaves from the coaxial waveguide 21 to the antenna 20 stable.

Figure 8:
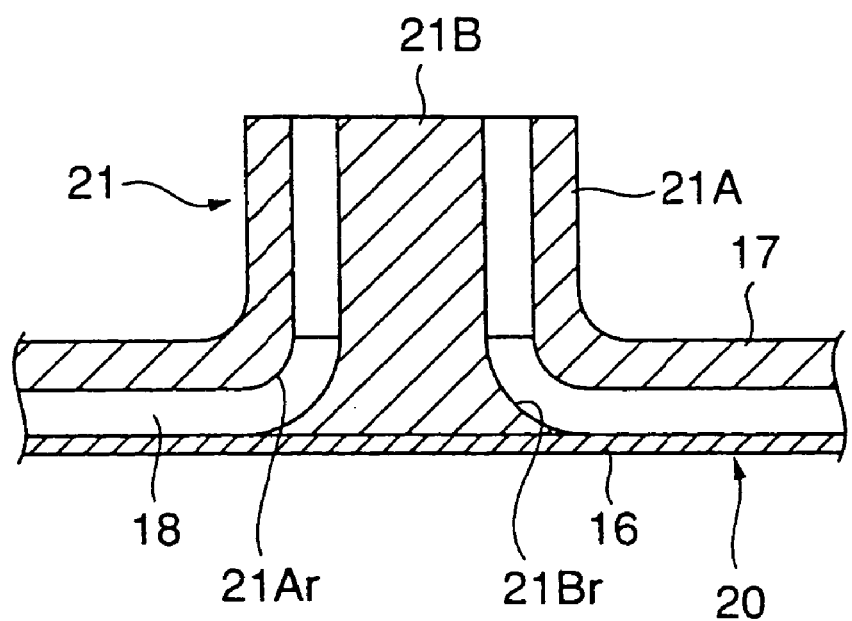
FIG. 8 is a diagram showing the construction of a microwave supplying structure according to a variation of the present embodiment.

In addition, in the microwave plasma processing apparatus 10 according to the present embodiment, as shown in a variation shown in FIG. 8, it is possible to replace the taper faces 21At and 21Bt with round faces 21Ar and 21Br, respectively. The change in impedance caused by the joint is further reduced by forming the round faces, which results in further efficient suppressing of the reflective wave.

Figure 1A:
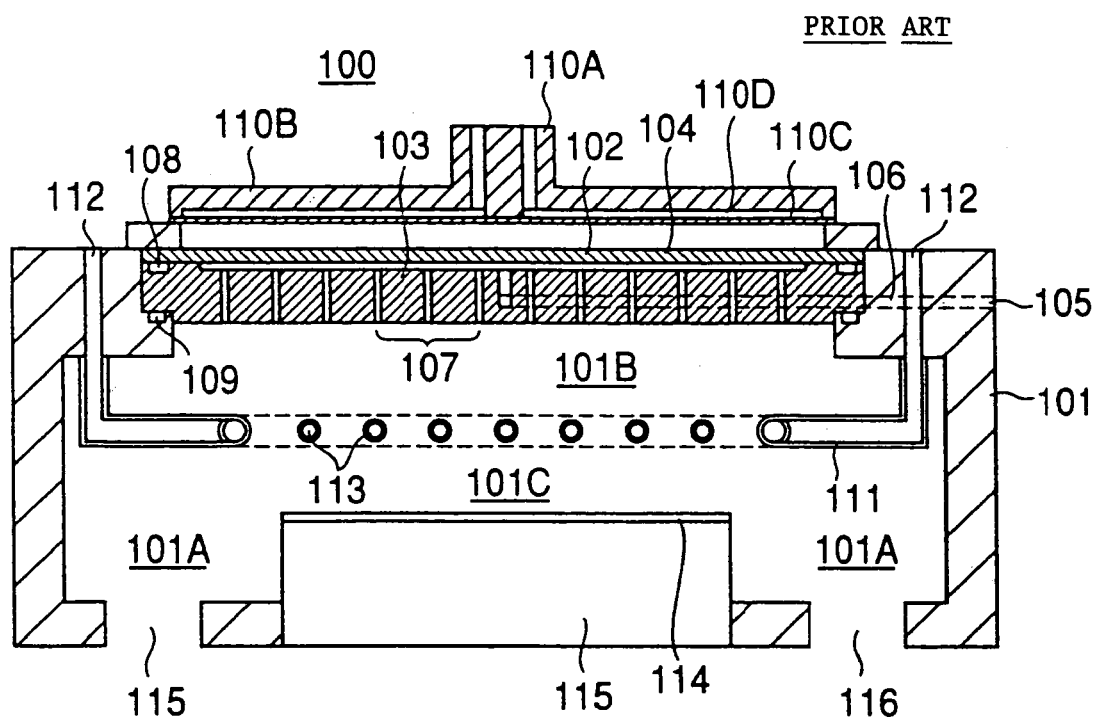
FIGS. 1A and 1B are diagrams showing the construction of a conventional microwave plasma processing apparatus that uses a radial line slot antenna.
Figure 1B:
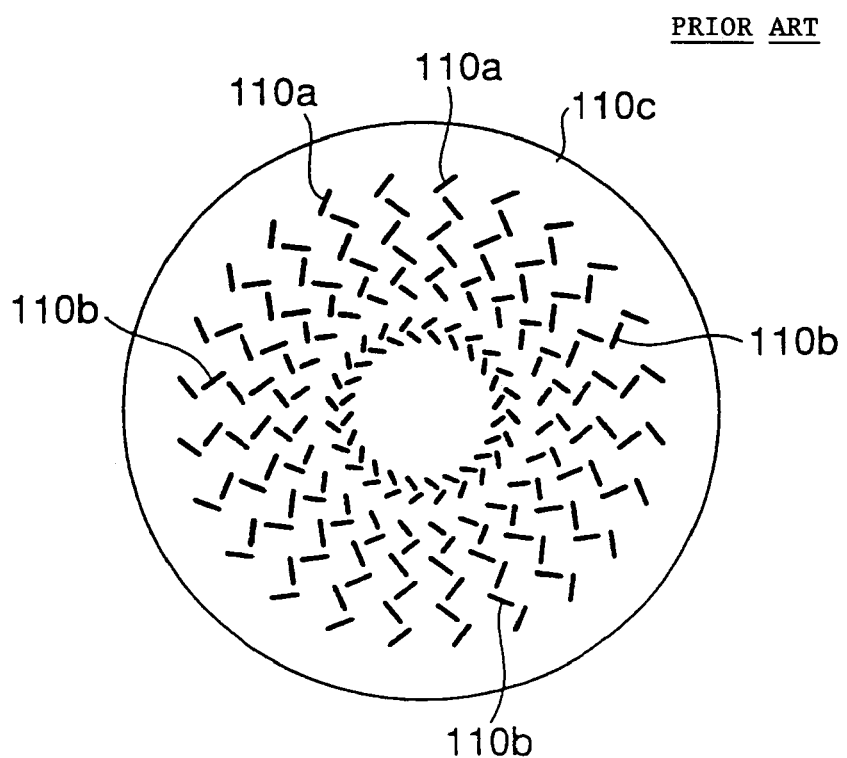

In the microwave plasma processing apparatus 10 of the present embodiment, the distance between the shower plate 14 exposed to the heat caused by the plasma and the cooling unit is reduced substantially, compared with the conventional microwave plasma processing apparatus of FIGS. 1A and 1B. As a result, it becomes possible to use a material such as $Al_2O_3$ having a small dielectric loss and also a small thermal conductivity for the microwave transmission window in place of AlN, which is characterized by large dielectric loss. Thereby, the efficiency of plasma processing and hence the processing rate are improved while simultaneously suppressing the temperature rise of the shower plate.

In the microwave plasma processing apparatus 10 of the present embodiment, it is further noted that the gas including the reaction byproduct formed in the space 11C as a result of the substrate processing forms a stable gas flow to the space 11A at the outer surrounding area because of the reduced distance between the shower plate 14 and the substrate 12 facing the shower plate 14, and the byproduct is removed from the space 11C quickly. By maintaining the temperature of the outer wall of the processing vessel 11 to be about 150° C., it becomes possible to substantially eliminate the deposition of the reaction byproduct on the inner wall of the processing vessel 11, and the processing apparatus 10 quickly becomes ready for the next process.

By the way, in the above description of the present embodiment, specific dimensions are mentioned, but the present invention is not limited to such dimensions.

SECOND EMBODIMENT

Figure 9:
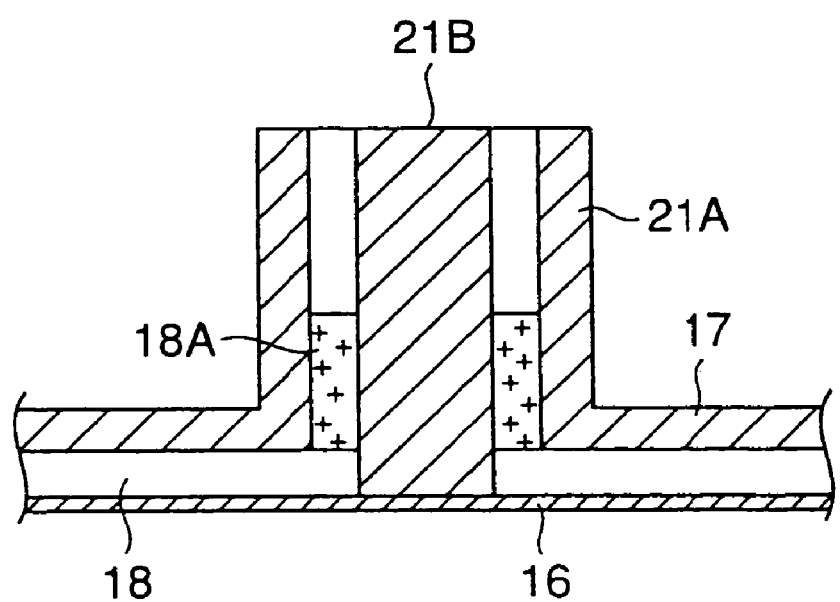
FIG. 9 is a diagram showing the construction of a microwave supplying structure according to a second embodiment of the present invention.

FIG. 9 shows the construction of the joint/supplying unit between the coaxial waveguide 21 and the radial line antenna 20 according to a second embodiment of the present invention. In FIG. 9, portions previously described are referred to by the same reference numerals, and their description will be omitted.

Referring to FIG. 9, the outer waveguide 21A constructing the coaxial waveguide 21 and the body 17 of the radial line antenna 20 are connected perpendicularly to each other forming the joint/supplying unit that is perpendicularly bent. The inner conductor 21B is also connected to the slot plate 16 perpendicularly.

Meanwhile, in the construction of FIG. 9, the retardation plate 18 is made of $Al_2O_3$ having a high relative permittivity, and a ring-shaped member 18A made of $SiO_2$, for example, is formed between the outer waveguide 21A and the inner conductor 21B so that an end of the member 18A contacts the retardation plate 18.

Because of this construction, the impedance changes stepwise, and the reflective waves are reduced. The length of the member 18A can be optimized based on the property of the antenna structure of the coaxial waveguide 21 and the antenna 20.

Figure 10:
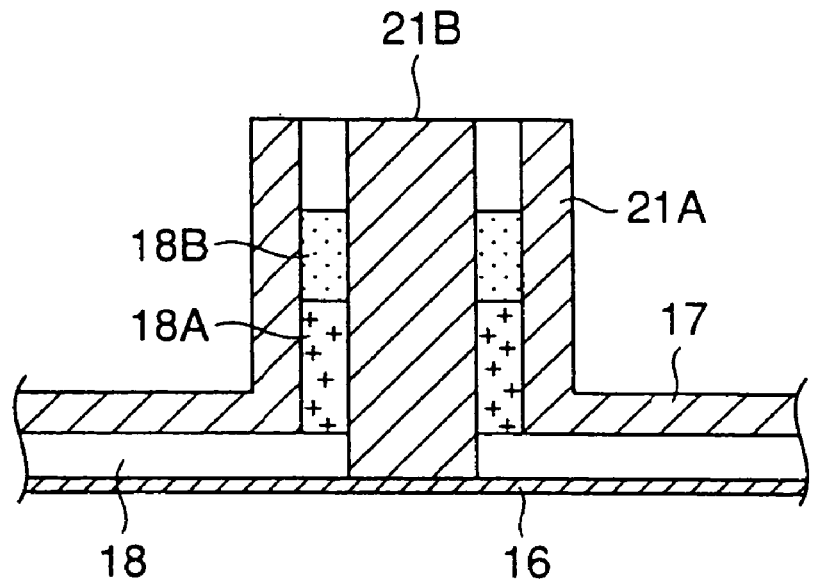
FIG. 10 is a diagram showing a variation of the microwave supplying structure of FIG. 9.

In the embodiment of FIG. 9, the second edge face opposing the first edge face in contact with the retardation plate 18 is exposed to air. As is shown in FIG. 10, it is possible, however, to provide another ring-shaped member 18B made of Teflon, for example, having smaller relative permittivity on the second face of the ring-shaped member 18A and to increase the number of steps in the impedance change at the joint unit.

Figure 11:
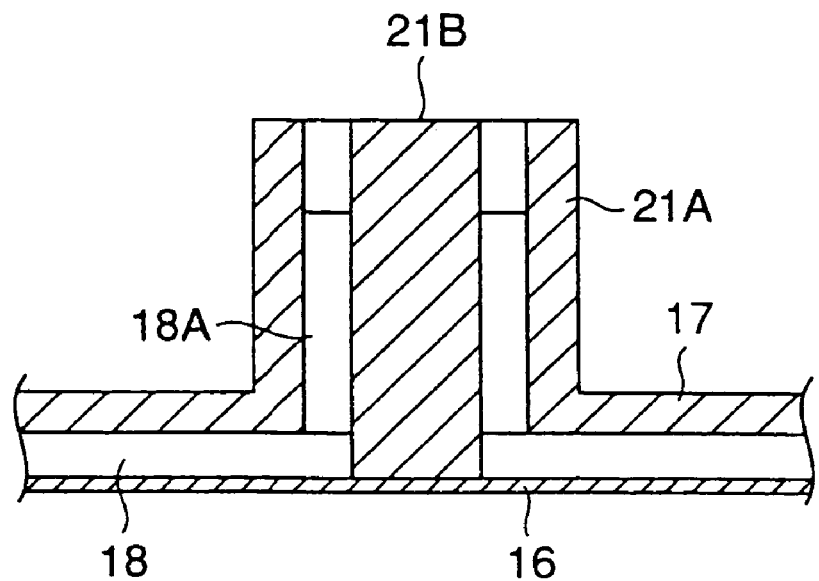
FIG. 11 is a diagram showing another variation of the microwave supplying structure of FIG. 9.

Further, as is shown in FIG. 11, the ring-shaped member 18A may be made of sintered mixture of $SiO_2$ and $Si_3N_4$ having different permittivity, and the mixture ratio of $SiO_2$ and $Si_3N_4$ in the ring-shaped member 18A may be controlled so that the permittivity continuously increases from the first edge face to the second edge face.

Figure 12:
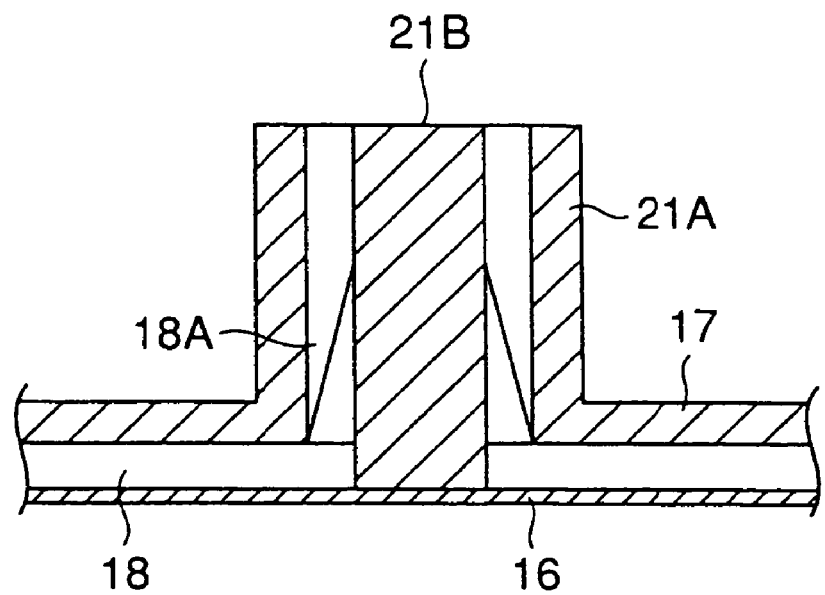
FIG. 12 is a diagram showing another variation of the microwave supplying structure of FIG. 9.

FIG. 12 shows the construction of the joint unit between the coaxial waveguide 21 and the radial line antenna 20 according to another variation of the present embodiment. In FIG. 12, portions previously described are referred to by the same reference numeral, and their description will be omitted.

Referring to FIG. 12, in this variation, the second edge face of the ring-shaped member 18A is considered to be a taper surface, and the thickness of the ring-shaped member 18A is linearly increased toward the retardation plate 18.

Using this construction, in the case where the ring-shaped member 18A is made of the same material as the retardation plate 18 such as $Al_2O_3$, the impedance of the joint/supplying unit increases continuously toward the retardation plate 18, and reflection caused by the rapid change in impedance is reduced, which results in an efficient and stable supply of microwaves.

Figure 13:
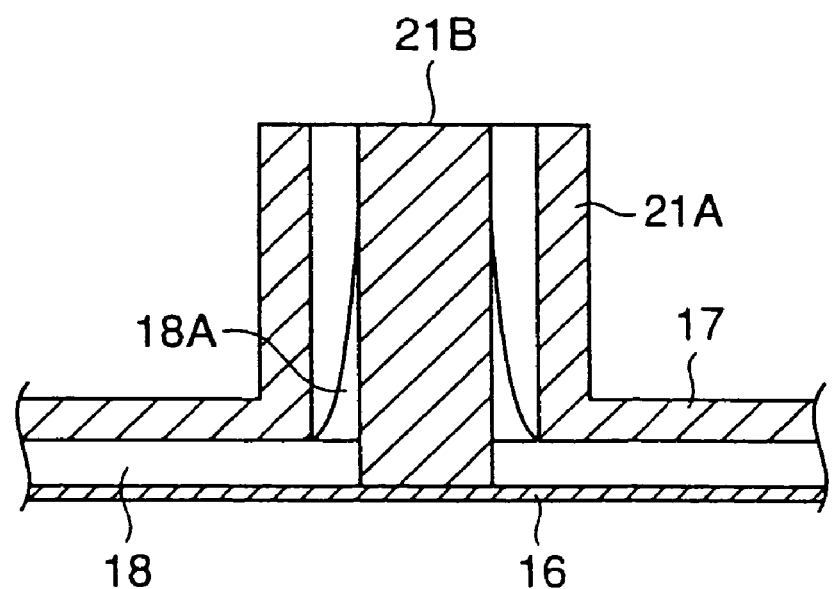
FIG. 13 is a diagram showing yet another variation of the microwave supplying structure of FIG. 9.

In addition, as is shown in FIG. 13, in a variation it is also possible to make the taper face of the ring-shaped member 18A a curved surface so that the thickness of the ring-shaped member 18A changes non-linearly to the property of the joint/supplying unit. For example, it is possible to increase the thickness of the ring-shaped member 18A exponentially.

Figure 14:
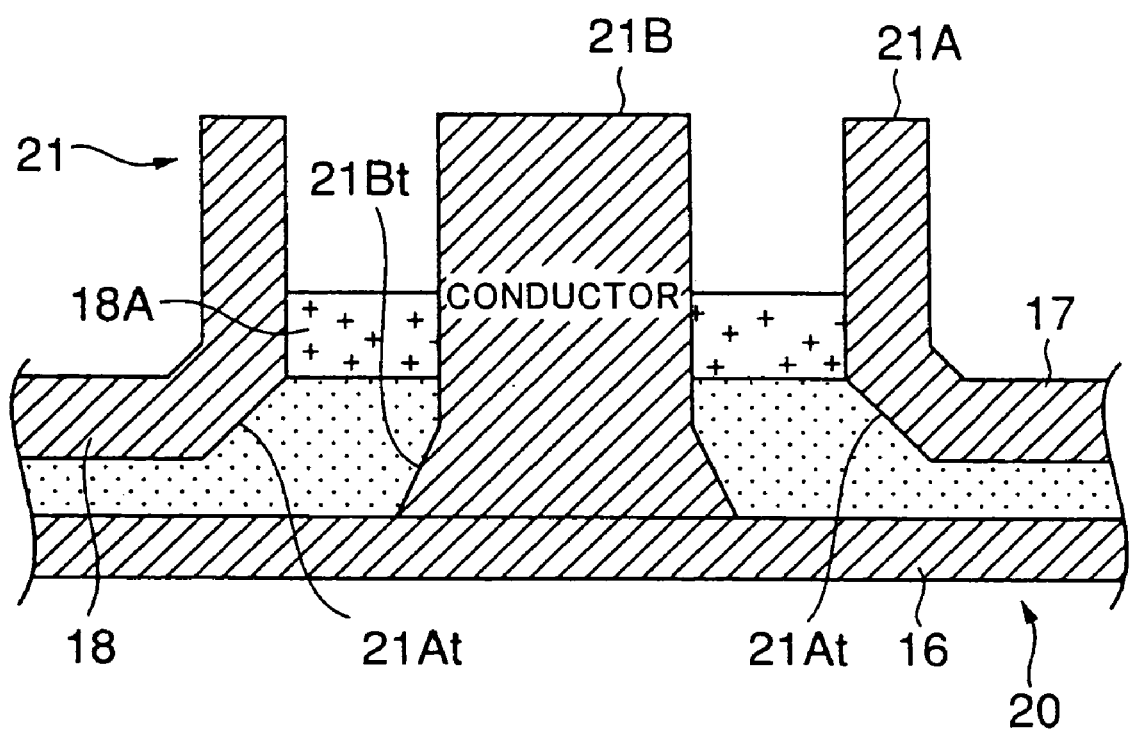
FIG. 14 is a diagram showing yet another variation of the microwave supplying structure of FIG. 9.

Further, as is shown in FIG. 14, the ring-shaped member 18A may be coupled with the construction of FIG. 3A having taper surfaces 21At and 21Bt. In this case, the ring-shaped member 18A is not limited to that of FIG. 9, but may be any construction of FIGS. 9 through 13.

THIRD EMBODIMENT

Figure 15:
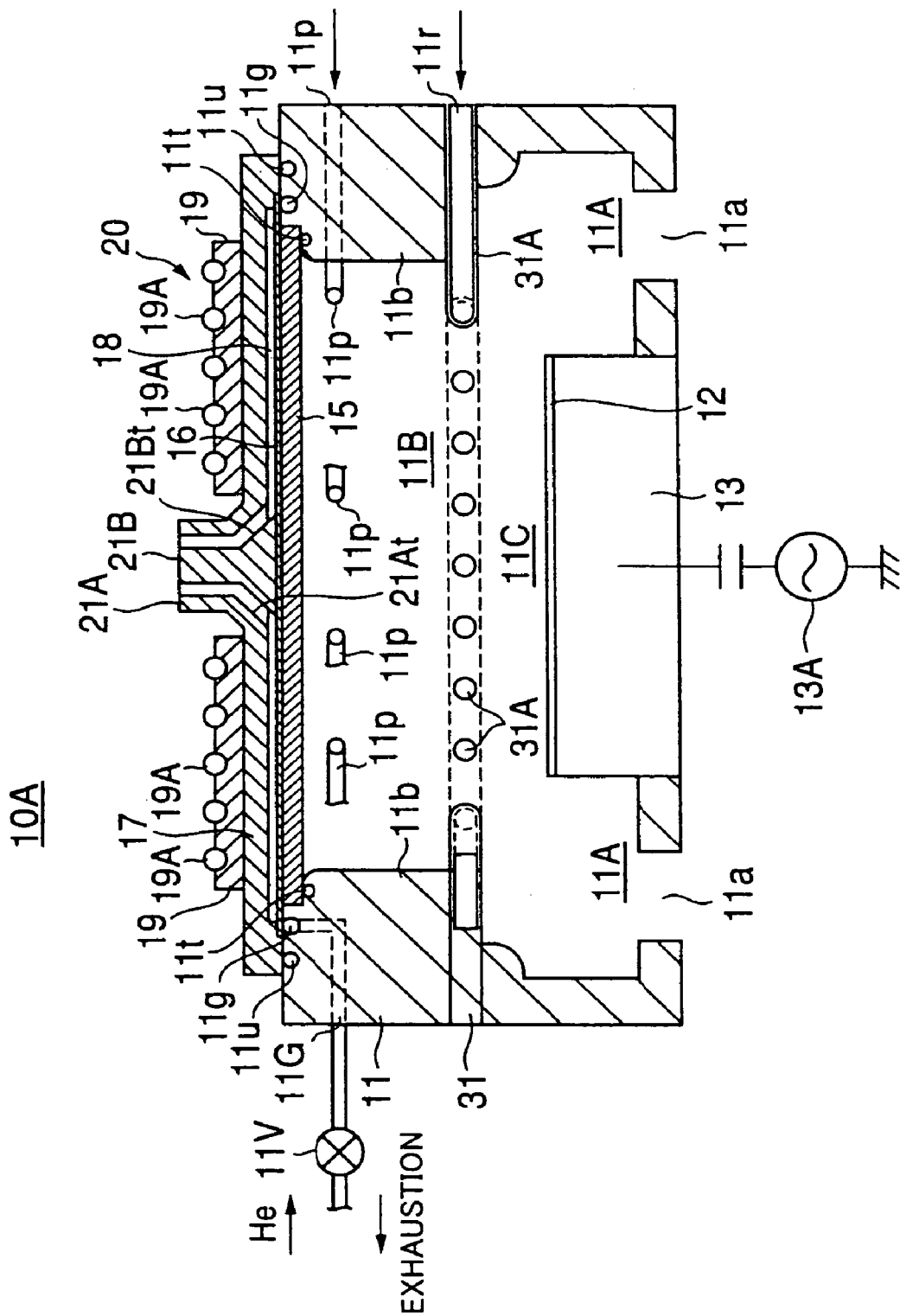
FIG. 15 is a diagram showing the construction of microwave plasma processing apparatus according to a third embodiment of the present invention.

FIG. 15 is a diagram showing the construction of a plasma processing apparatus 10A according to a third embodiment of the present invention. In FIG. 15, the parts described earlier are referred to by the same reference numerals, and their description is omitted.

Referring to FIG. 15, in the plasma processing apparatus 10A, the shower plate 14 is removed, and a plurality of plasma gas inlets 11P are formed, preferably in symmetry, in communication with the gas passage lip in the processing vessel 11. In the plasma processing apparatus 10A according to the present embodiment, the construction is simplified, and the fabrication cost can be reduced substantially.

In the plasma processing apparatus 10A thus constructed, the reflection of microwaves is reduced by forming the taper surfaces 21At and 21Bt in the joint/supplying unit between the radial line slot antenna 20 and the coaxial waveguide 21, which results in an increase in the power supplying efficiency, a reduction in abnormal discharge caused by the reflective waves, and an increased stability of the plasma formation. In the present embodiment, the construction of the joint unit is not limited to that shown in FIG. 3A, and any construction of FIGS. 8 through 14 can be used.

FOURTH EMBODIMENT

Figure 16:
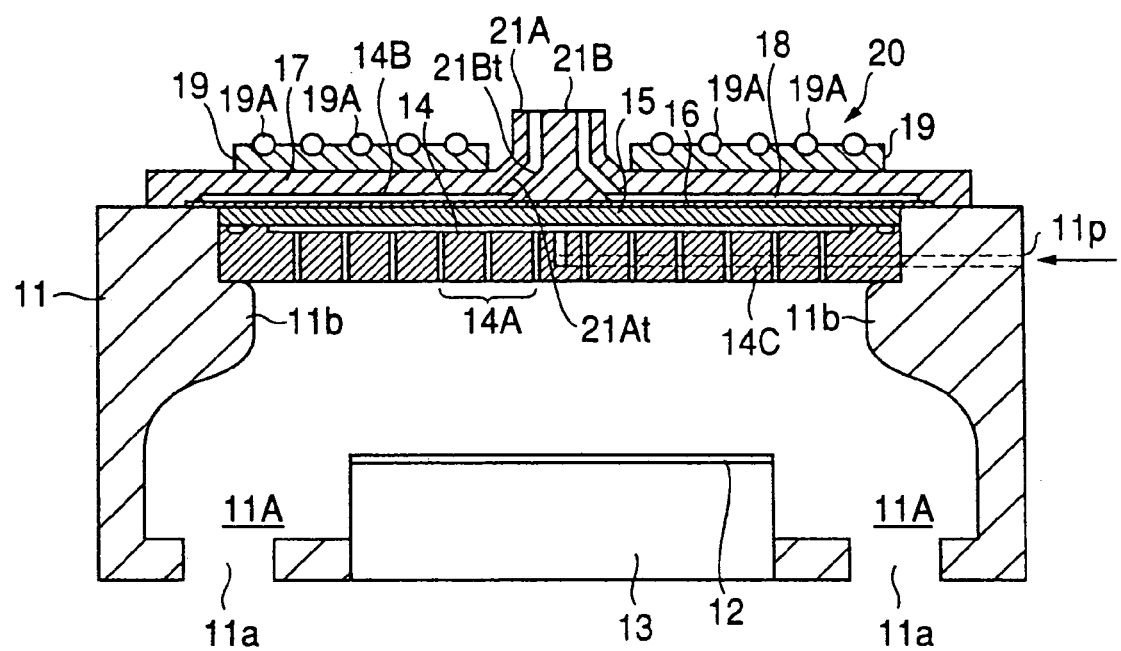
FIG. 16 is a diagram showing the construction of microwave plasma processing apparatus according to a fourth embodiment of the present invention.

FIG. 16 is a diagram showing the construction of a microwave plasma processing apparatus 10B according to a fourth embodiment of the present invention. In FIG. 16, parts that have been previously described are referred to by the same numerals, and their description will be omitted.

Referring to FIG. 16, in the construction of the microwave plasma processing apparatus 10B, the process gas supply structure 31 is removed. Additionally, the entire face of the extending part 11b holding the shower plate 14 is rounded out.

The plasma processing apparatus 10B thus constructed cannot perform film-forming or etching by supplying a process gas besides the plasma gas since the lower shower plate 31 is removed. The plasma processing apparatus 10B, however, can form an oxidized layer, a nitrified layer, or an oxidized-nitrified layer by supplying an oxidizing gas or a nitrifying gas from the shower plate 14 together with the plasma gas.

In the plasma processing apparatus 10B thus constructed, the reflection of microwaves is reduced by forming the taper surfaces 21At and 21Bt in the joint/supplying unit between the radial line slot antenna 20 and the coaxial waveguide 21, which results in an increase in the power supplying efficiency, a reduction in abnormal discharge caused by the reflective waves, and an increased stability of the plasma formation. In the present embodiment, the construction of the joint unit is not limited to that shown in FIG. 3A, and any construction of FIGS. 8 through 14 can be used.

FIFTH EMBODIMENT

The joint/supplying structure according to the present invention is not limited to the plasma processing apparatus 10 of FIG. 2A or its variation, and is applicable to the plasma processing apparatus 100 using a conventional radial line slot antenna previously described by referring to FIGS. 1A and 1B.

Figure 17:
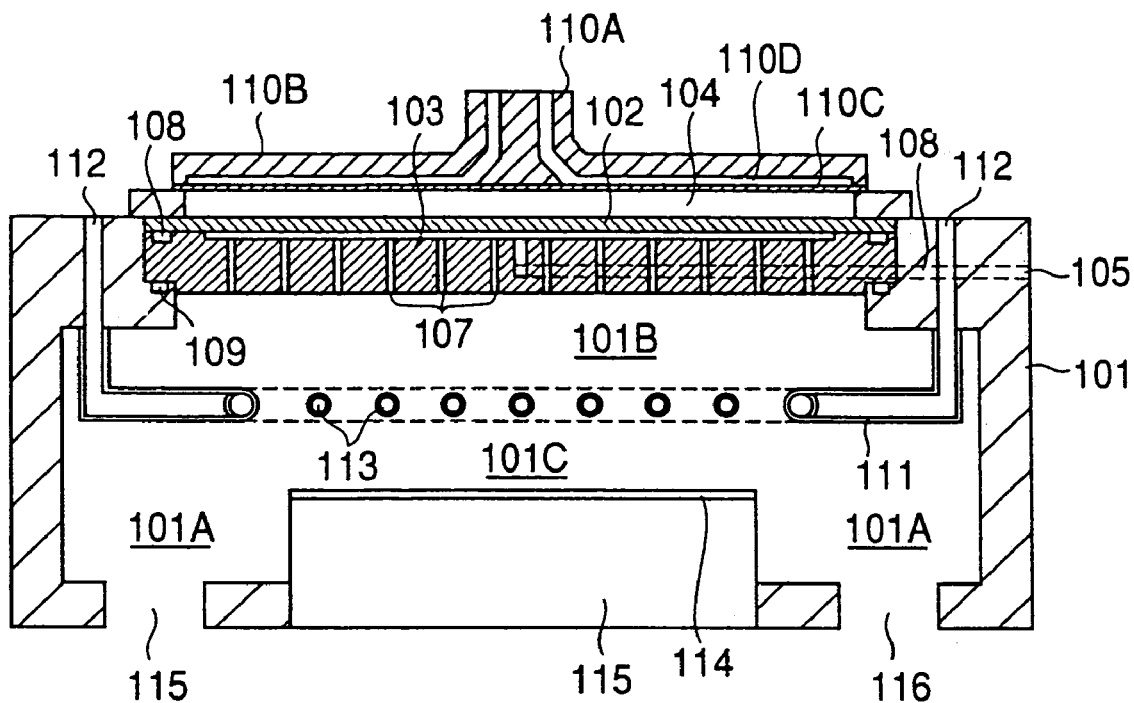
FIG. 17 is a diagram showing the construction of microwave plasma processing apparatus according to a fifth embodiment of the present invention.

FIG. 17 shows the construction of a plasma processing apparatus 100A according to a fifth embodiment of the present invention using the joint/supplying structure of the present invention. In FIG. 17, the parts previously described are referred to by the same numerals, and their description will be omitted.

Referring to FIG. 17, the plasma processing apparatus 100A has substantially the same construction as the conventional plasma processing apparatus 100, but is different in that the plasma processing apparatus 100A includes taper surfaces similar to the taper surfaces 21At and 21Bt in the joint unit between the coaxial waveguide 110A and the radial slot antenna body 110B or the slot plate 110D.

In the present embodiment, the reflection of microwaves is reduced by forming the taper surfaces in the joint/supplying unit between the coaxial waveguide 110A and the radial line slot antenna, which results in an increase in the power supplying efficiency, a reduction in abnormal discharge caused by the reflective waves, and an increased stability of the plasma formation. In the present embodiment, the construction of the joint unit is not limited to that shown in FIG. 3A, and any construction of FIGS. 8 through 14 can be used.

SIXTH EMBODIMENT

Figure 18:
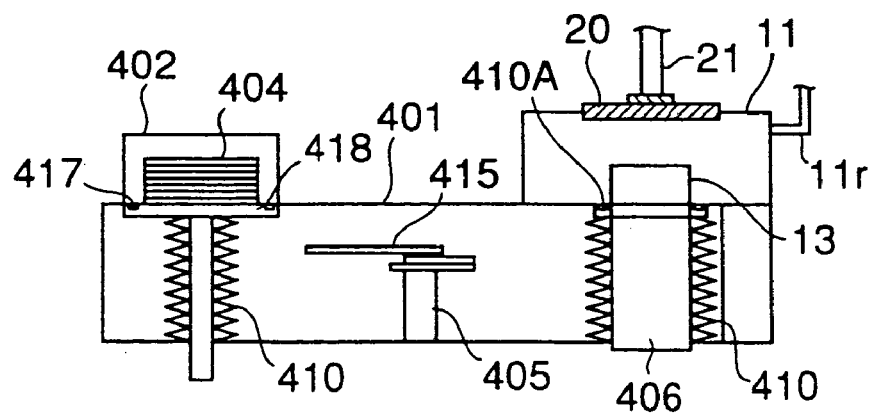
FIG. 18 is a diagram showing the construction of a semiconductor fabrication apparatus according to a sixth embodiment of the present invention, using the microwave plasma processing apparatus of FIGS. 2A and 2B.

FIG. 18 is a cross sectional view showing the entire construction of a semiconductor fabrication apparatus 40 according to a sixth embodiment of the present invention including the microwave plasma processing apparatus 10 of FIGS. 2A and 2B.

Referring to FIG. 18, the semiconductor fabrication apparatus 40 includes a vacuum transfer room 401 provided with a robot 405 having a transportation arm 415, and the microwave plasma processing apparatus 10 is formed on the top face of the vacuum transfer room 401. In this case, the stage 13 can be moved up and down by a cylinder 406 covered by a bellows 410. When the stage 13 descends to the end, the substrate 12 is set or taken out by the transportation arm 415. When the stage 13 ascends to the end, the substrate 12 is shut off from the vacuum transfer room 401 by a seal 410A and processed as desired.

A load lock room 402 having a stage 418 to hold a stack of substrates is provided at another position on the upper side of the vacuum transfer room 401. When the stage 418 ascends to the end, the load rock room 402 is shut off from the vacuum transfer room 401 by a seal 417. Meanwhile, when the stage 418 descends to the end, the substrate stack 404 descends to the vacuum transfer room 401, and the transportation arm 415 picks up a substrate from the substrate stack 404 or returns a processed substrate thereto.

In the case of semiconductor fabrication apparatus 40 thus constructed, since a substrate is loaded and unloaded vertically, and not through a side wall, an axially symmetry plasma is formed in the processing vessel 11, and a gas in the processing vessel is exhausted through a plurality of exhaustion ports provided in an axial symmetry by a plurality of pumps. Accordingly, the semiconductor fabrication apparatus 40 can guarantee uniform plasma processing.

Figure 19:
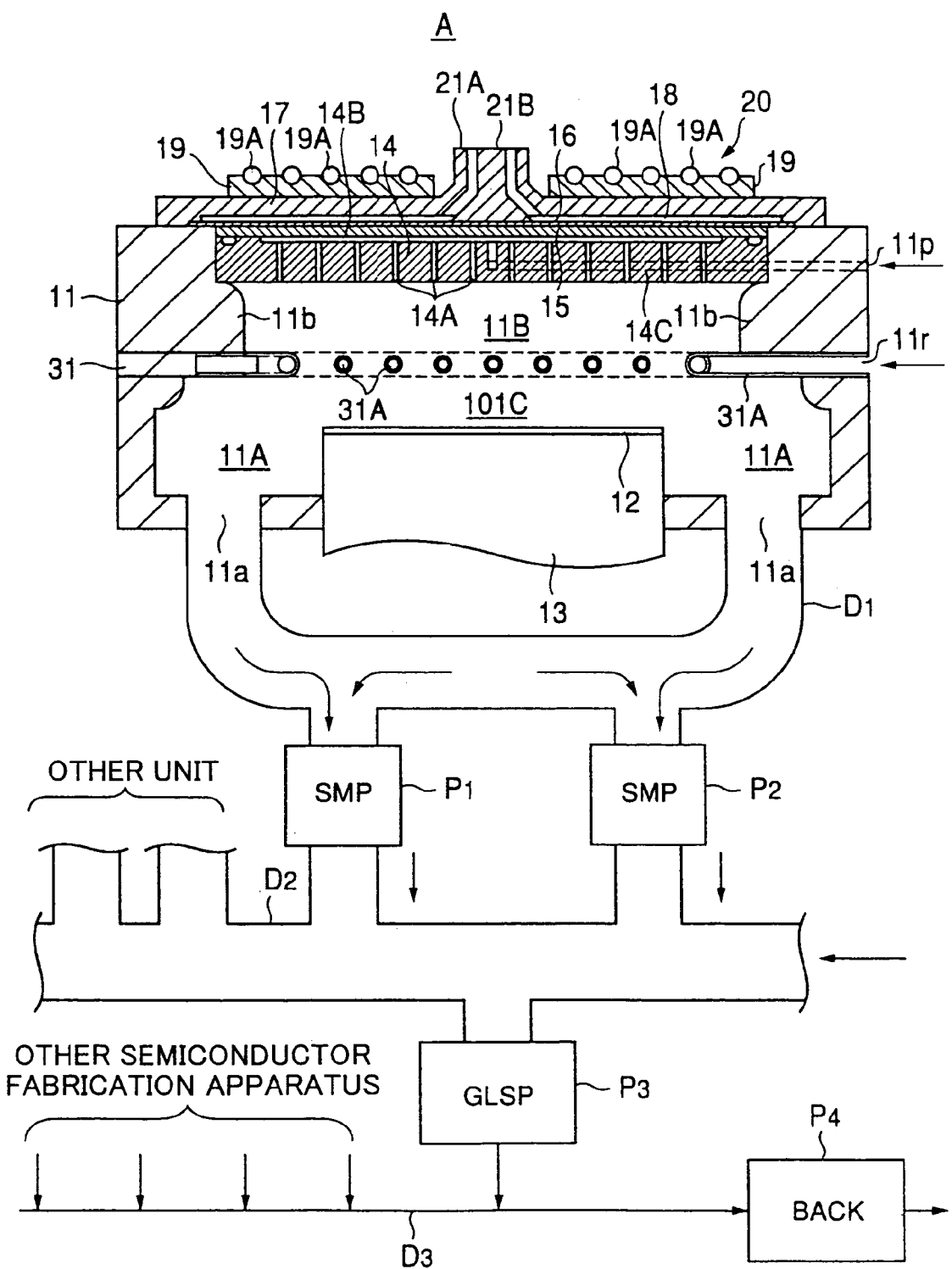
FIG. 19 is a diagram showing the construction of an exhaustion system of the semiconductor fabrication apparatus of FIG. 18.

FIG. 19 shows the construction of an exhaustion system of the process unit A.

Figure 20A:
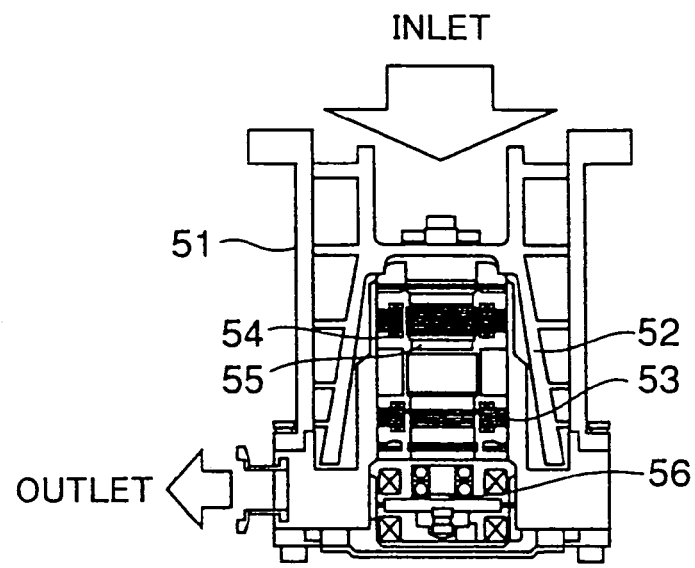
FIG. 20 is a diagram showing the construction of a screw molecular pump used for the exhaustion system of FIG. 19.
Figure 20B:
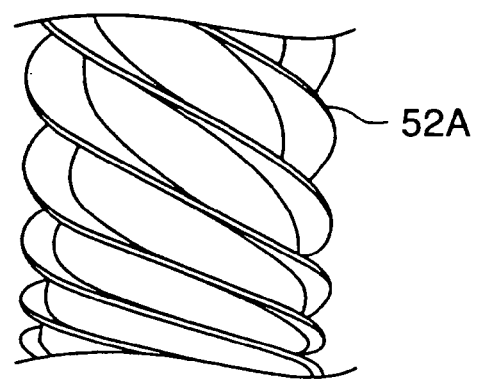

Referring to FIG. 19, in the process unit A, each exhaustion port 11a of the processing vessel 11 is connected to a duct D1, and a gas in the processing vessel 11 is exhausted by screw molecular pumps P1 and P2, each having a construction as shown in FIGS. 20A and 20B, provided in the duct D1. The screw molecular pumps P1 and P2 are connected, at their exhaustion side, to an exhaustion line D2 commonly provided to the other processing units B and C of the semiconductor fabrication apparatus 40. The exhaustion line D2 is connected to an exhaustion line D3 commonly provided to the other semiconductor fabrication apparatuses via an intermediate booster pump P3.

FIG. 20A shows the construction of the screw molecular pumps P1 and P2.

Referring to FIG. 20A, the screw molecular pump has a cylindrical body 51 and a pump inlet at an end part of the body 51 and a pump outlet on the sidewall of the body 51 near the bottom part. In the body 51, there is provided a rotor 52 shown in FIG. 20B, and a gradational lead screw 52A is formed on the rotor 52. It should be noted that the gradational lead screw 52A has a construction in which there is a large pitch formed at the pump inlet part and the pitch is decreased toward the outlet. Associated with this, the lead angle of the screw is decreased gradually from the inlet side toward the outlet side. Further, the volume of the pump chamber is decreased gradually from the inlet side toward the outlet side.

Further, the screw molecular pump of FIG. 20A includes a motor 53 provided in the rotor 52, an angle detector 54 detecting the angular position of the rotor 52 and a magnet 55 cooperating with the angle detector 54, wherein the rotor 52 is urged toward the outlet side by an electromagnet mechanism 56.

Such a screw molecular pump has a simple construction and is operable over a wide pressure range from the atmospheric pressure to several millitorrs with small electric power consumption. Further, the screw pump can obtain a pumping speed reaching 320 mL/min, which is larger than the pumping speed of conventional turbo molecular pumps.

Figure 21:
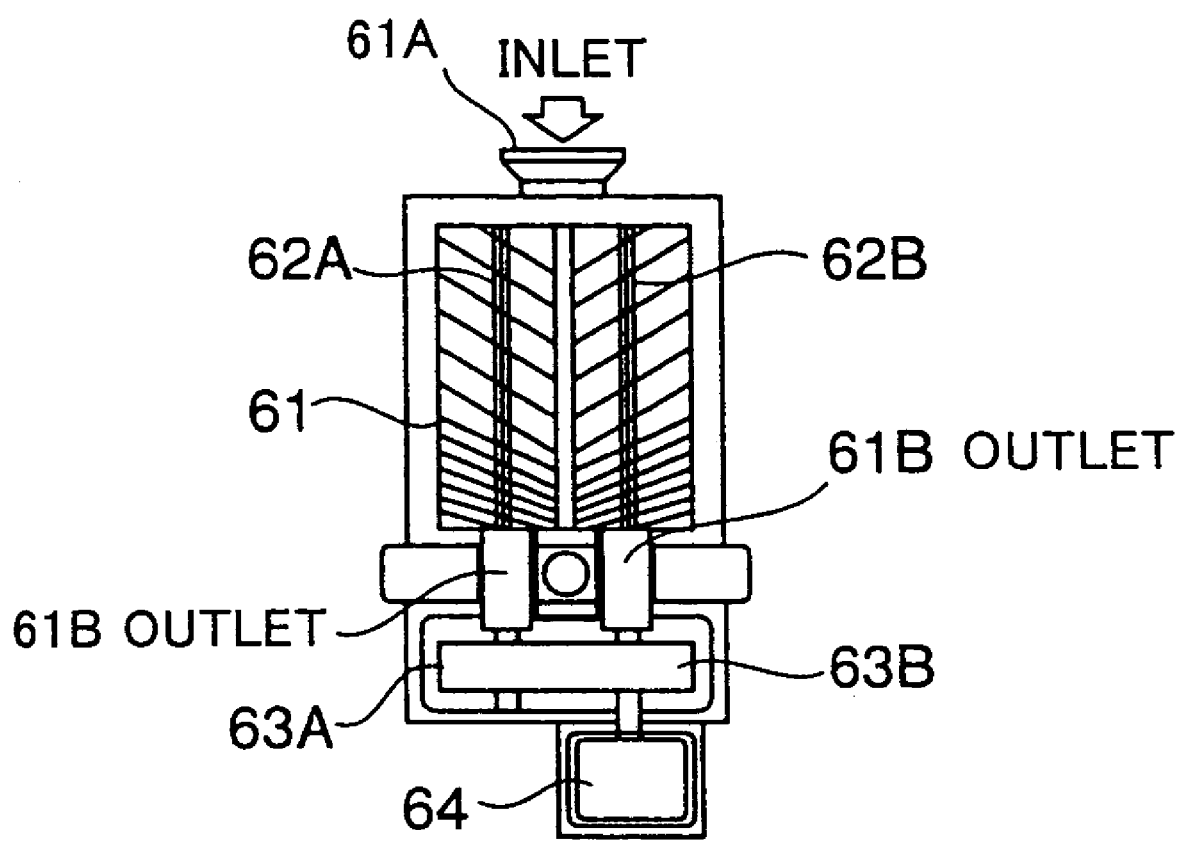
FIG. 21 is a diagram showing the construction of a gradational lead screw pump used for the exhaustion system of FIG. 19.

FIG. 21 shows the construction of a gradational lead screw pump (GLSP) 60 used for the intermediate booster pump P3 for evacuating the screw pumps P1 and P2 in the construction of FIG. 19.

Referring to FIG. 21, the gradational lead screw pump includes, in a pump body 61 having an inlet 61A at an end and outlets 63A and 63B at another end, a pair of screw rotors 62A and 62B each changing a screw pitch thereof gradually from an inlet side to an outlet side as shown in FIG. 20B, in a meshing relationship of the screws, wherein the rotors 62A and 62B are driven by a motor 64 via gears 63A and 63B.

The gradational lead screw pump 60 of such a construction is operable over a wide pressure range from ordinary pressure to a low pressure of as much as $10^{-4}$ Torr, and can achieve a flow rate reaching 2,500 L/min.

In the construction of FIG. 19, in which the semiconductor fabrication apparatus is evacuated by the common back pump P4 via the intermediate booster pump P3, the back pump P4 is operated in the most efficient pressure range, and the electric power consumption is reduced substantially.

In the construction of FIG. 19, the back pump P4 can operate at the most efficient pressure range by exhausting the exhausted gas from the other semiconductor fabrication apparatus, which results in a substantially reduced power consumption.

Figure 22:
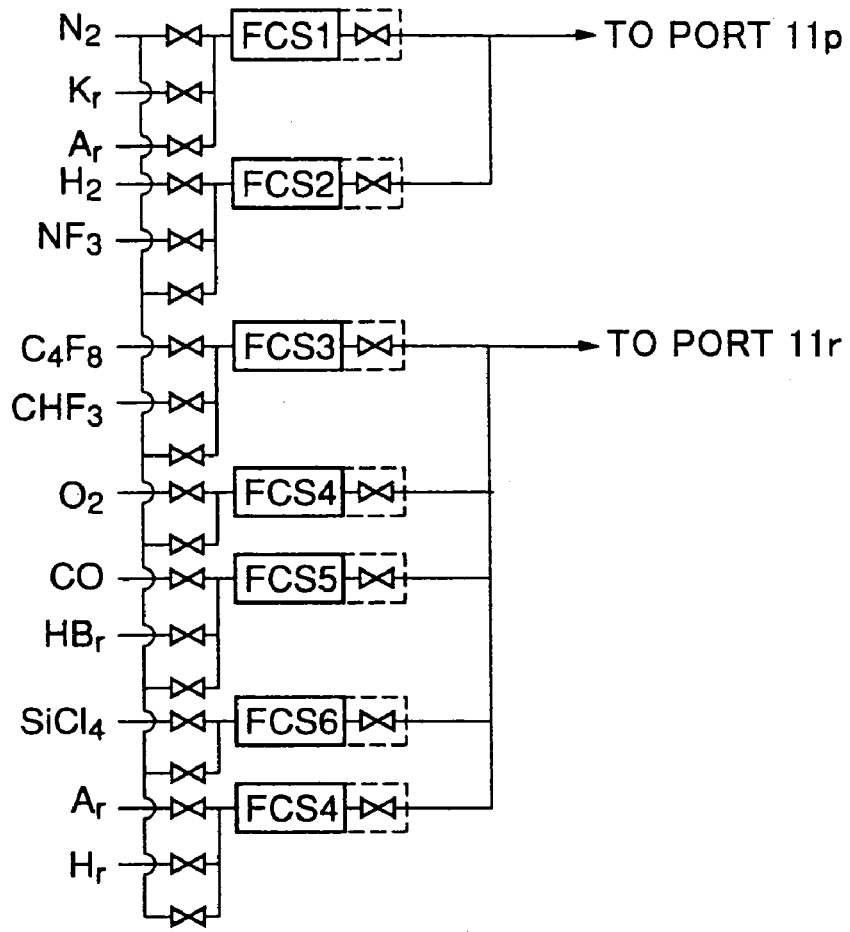
FIG. 22 is a diagram showing the construction of a gas supplying system used for the processing unit of FIG. 19.

FIG. 22 shows the construction of the gas supplying system cooperating with each of the processing units A-C in the semiconductor fabrication apparatus 40 of FIG. 18.

As explained before, the semiconductor fabrication apparatus 40 avoids deposition of reaction byproduct formed associated with the substrate processing on the processing vessel 11 of the microwave plasma processing apparatus 10 by maintaining the processing vessel 11 at a temperature of about 150° C. Thus, the processing unit of FIG. 19 has a feature that the memory or hysteresis of the preceding processing can be erased completely without conducting a specific cleaning process.

Thus, by using the processing unit of FIG. 19, it becomes possible to conduct different substrate processing one after another by switching the plasma gas and/or process gas. For this, however, it is necessary to provide a gas supply system that can switch the process gas quickly.

Referring to FIG. 22, one or two gases selected fro $N_2$, Kr, Ar, $H_2$, $NF_3$, $C_4F_8$, $CHF_3$, $O_2$, CO, HBr, $SiCl_4$ and the like, are supplied to the plasma gas inlet port 11p provided on the processing vessel 11 in communication with the shower plate 14 through the first and/or second flow rate control apparatuses FCS1 and FCS2, and one or more gases selected from $N_2$, Kr, Ar, $H_2$, $NF_3$, $C_4F_8$, $CHF_3$, $O_2$, CO, HBr, $SiCl_4$ and the like, are supplied to the process gas inlet port 11r communicating with the process gas supply structure 30 via the third through seventh flow rate control apparatuses FCS3-FCS7.

Figure 23:
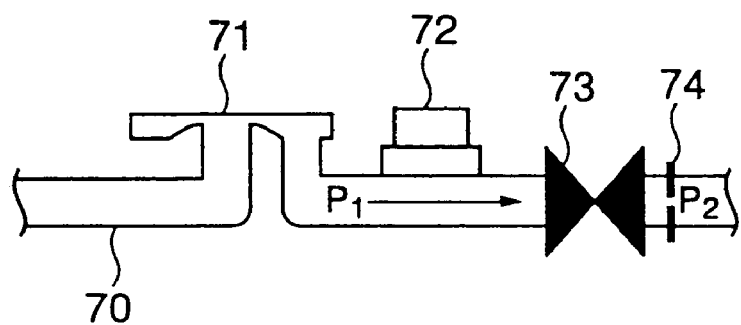
FIG. 23 is a diagram showing the construction of a current control apparatus used for the gas supplying system of FIG. 22.

By using a flow rate control apparatus as shown in FIG. 23, having a construction in which a control valve 71, a manometer 72, a stop valve 73 and an orifice 74 are formed consecutively on a straight tube 70 and by controlling the pressure $P_2$ at the downstream side of the orifice 74 to be equal to or smaller than one-half the pressure $P_1$ at the upstream side of the stop valve 73 ($P_1 \geq 2P_2$), it becomes possible to supply the process gas instantaneously with a predetermined flow rate. This is because there is no dead space in the flow rate control apparatus in which flow rate control is not possible.

Thus, by using the flow control apparatus of FIG. 23 in the gas supply system of FIG. 22, it becomes possible to switch the plasma gas or process gas instantaneously depending on the type of the substrate processing to be conducted in the processing unit.

In the semiconductor fabrication apparatus 40, it is noted that not only the plasma processing apparatus 10 but also the plasma processing apparatuses according to the modifications thereof, or the plasma processing apparatuses 10A and 10B according to other embodiments can also be used.

Further, the present invention is not limited to the specific embodiments noted above but various variations and modifications may be made within the scope of the invention set forth in claims.

INDUSTRIAL APPLICABILITY

According to the present invention, in the microwave plasma processing apparatus, the rapid change in impedance caused by the joint between the coaxial waveguide providing microwaves and the microwave antenna radiating the microwaves in the processing vessel of the plasma processing apparatus is reduced. As a result, the reflection of microwaves caused by the rapid change in impedance is suppressed which results in forming stable microwave plasma in the processing vessel.

What is claimed is:

1. A plasma processing apparatus, comprising:
a processing vessel defined by an outer wall and having a stage for holding a substrate to be processed:
an evacuation system coupled to said processing vessel;
a microwave transparent window provided on said processing vessel as a part of said outer wall, and opposite said substrate held on said stage;
a plasma gas supplying part for supplying plasma gas to said processing vessel;
a microwave antenna provided on said processing vessel in correspondence to said microwave; and
a microwave power source electrically coupled to said microwave antenna, wherein said microwave antenna comprises:
a coaxial waveguide connected to said microwave power source, said coaxial waveguide having an inner conductor core and an outer conductor tube surrounding said inner conductor core; and an antenna body provided to a point of said coaxial waveguide; said antenna body comprising:
  a first conductor surface forming a microwave radiation surface coupled with said microwave transparent window provided thereunder;
  a dielectric plate provided upon said first conductor surface; and
  a second conductor surface provided upon said dielectric plate and being connected to said first conductor surface at a peripheral part of said dielectric plate,
  wherein said inner conductor core is connected to said first conductor surface by a first joint unit and said outer conductor tube is connected to said second conductor surface by a second joint unit;
  wherein said first joint unit forms a first taper unit in which an outer diameter of said inner conductor core increases toward said first conductor surface and said second joint unit forms a second taper unit in which an inner diameter of said outer conductor tube increases toward said first conductor surface;
  wherein said first taper unit is defined by a first curved surface and said second taper unit is defined by a second curved surface;
  a dielectric member is provided in a space between said inner conductor core, and said outer conductor tube, said dielectric member being defined by a first edge face and a second edge face opposing said first edge face, said dielectric member being immediately proximate said dielectric plate, a permittivity of said dielectric member being lower than a permittivity of said dielectric plate and higher than a permittivity of air;
  wherein the microwave plasma processing apparatus further comprising another dielectric member in a space between said inner conductor core and said outer conductor tube, adjacent to said second edge face of said dielectric member, a permittivity of said other dielectric member being lower than a permittivity of said dielectric member and higher than a permittivity of air; and
  wherein said dielectric member is made of silicon oxide, and said other dielectric member is made of Teflon.

2. A plasma processing apparatus, comprising:
a processing vessel defined by an outer wall and having a stage for holding a substrate to be processed;
an evacuation system coupled to said processing vessel;
a microwave transparent window provided on said processing vessel as a part of said outer wall, opposite said substrate held on said stage;
a plasma gas supplying part for supplying plasma gas to said processing vessel;
a microwave antenna provided on said processing vessel in correspondence to said microwave; and
a microwave power source electrically coupled to said microwave antenna, wherein said microwave antenna comprises:
  a coaxial waveguide connected to said microwave power source, said coaxial waveguide having an inner conductor core and an outer conductor tube surrounding said inner conductor core; and
  an antenna body provided to a point of said coaxial waveguide, said antenna body comprising:
    a first conductor surface forming a microwave radiation surface coupled with said microwave transparent window provided thereunder;
    a dielectric plate provided upon said first conductor surface; and
    a second conductor surface provided upon said dielectric plate and being connected to said first conductor surface at a peripheral part of said dielectric plate,
    wherein said inner conductor core is connected to said first conductor surface by a first joint unit and said outer conductor tube is connected to said second conductor surface by a second joint unit; and
    a dielectric member is provided in a space between said inner conductor core, said outer conductor tube, and said dielectric plate, said dielectric member being defined by a first edge face and a second edge face opposing said first edge face and wherein a permittivity of said dielectric member being lower than a permittivity of said dielectric plate and higher than a permittivity of air;
    wherein, in said second joint unit, said outer conductor core is connected substantially perpendicularly to said second conductor surface;
    wherein, in a space between said inner conductor core and an outer waveguide, another dielectric member having a permittivity lower than a permittivity of said dielectric member and higher than a permittivity of air is provided adjacent to said second edge face of said dielectric member;
    wherein said dielectric member is made of silicon oxide, and said other dielectric member is made of Teflon.

* * * * *